United States Patent [19]
Nakata

[11] Patent Number: 6,035,004
[45] Date of Patent: Mar. 7, 2000

[54] DIGITAL RADIO RECEIVER

[75] Inventor: Hiroshi Nakata, Tokyo, Japan

[73] Assignee: Mitsubishi Denki Kabushiki Kaisha, Japan

[21] Appl. No.: 08/562,285

[22] Filed: Nov. 22, 1995

[30] Foreign Application Priority Data

Nov. 2, 1995 [JP] Japan ..................................... 7-285742

[51] Int. Cl.$^7$ .............................. H03D 1/00; H04L 27/06
[52] U.S. Cl. ........................... 375/340; 375/349; 324/670
[58] Field of Search ................................. 375/340, 346, 375/349, 350, 344, 376, 316, 235, 231; 455/71, 75, 76, 182.2, 183.2, 192.2, 259, 260; 331/14, 16, 18; 324/669, 670, 620–626, 685, 721

[56] References Cited

U.S. PATENT DOCUMENTS

| | | | |
|---|---|---|---|
| 4,507,617 | 3/1985 | Sasaki | 329/50 |
| 5,168,507 | 12/1992 | Critchlow et al. | 375/232 |
| 5,245,611 | 9/1993 | Ling et al. | 375/235 |
| 5,396,190 | 3/1995 | Murata | 330/149 |
| 5,404,378 | 4/1995 | Kimura | 375/296 |
| 5,552,749 | 9/1996 | Nowatski et al. | 331/14 |

FOREIGN PATENT DOCUMENTS

| | | | |
|---|---|---|---|
| 5-122263 | 5/1993 | Japan . | |
| 8107349 | 4/1996 | Japan | H03L 1/02 |

*Primary Examiner*—Chi H. Pham
*Assistant Examiner*—Bryan Webster
*Attorney, Agent, or Firm*—Rothwell, Figg, Ernst & Kurz, p.c.

[57] ABSTRACT

An inexpensive, compact digital radio receiver corrects IQ imbalance, non-orthogonal I and Q phases, and DC offset by a DSP. The digital radio receiver is equipped with an antenna, an RF/IF converter for converting a radio frequency into an intermediate frequency, an IQ separator for separating I and Q, a filter for eliminating a noise such as a radio frequency, a multiplying sampler for sampling the output of the filter, and a digital signal processing unit mainly comprised of the DSP which implements an algorithm for estimating and correcting an IQ distortion and also performs quadrature phase demodulation. The IQ distortion can be removed inexpensively by making use of a part of a standard radio operation, hardly requiring the use of hardware for adjustment.

11 Claims, 24 Drawing Sheets

| TEMPERATURE | $\bar{g}$ | $\dfrac{\bar{f}}{\bar{b}}$ | $\sqrt{\bar{b}}$ |
|---|---|---|---|
| −30 °C | 0.012 | 0.008 | 1.010 |
| −40 °C | 0.011 | 0.009 | 1.015 |
| ⋮ | ⋮ | ⋮ | ⋮ |

| TEMPERATURE | I offset | Q offset |
|---|---|---|
| −30 C | 0.004 | 0.008 |
| −40 C | 0.005 | 0.007 |
| ⋮ | ⋮ | ⋮ |

DIGITAL RADIO RECEIVER

BACKGROUND OF THE INVENTION

1. Field of the Invention

The present invention relates to a digital radio receiver for a portable telephone, a car phone, etc. which is provided with a digital signal processor (DSP). More particularly, the present invention relates to a digital radio receiver equipped with an algorithm designed to utilize the DSP, which functions to demodulate a digital signal, in order to minimize the need for manual adjustment, adjusting circuits, and expensive components, ensure freedom from the dependence on temperature changes, achieve equal inphase component (hereinafter referred to simply as "I") and quadrature component (hereinafter referred to simply as "Q") amplitudes, eliminate DC offset, and permit proper demodulation even if I and Q are not orthogonal.

2, Description of the Related Art

A conventional digital radio receiver will be described with reference to FIG. 27, FIG. 28, and FIG. 29. FIG. 27 is a block diagram showing the configuration of a demodulating system of the conventional digital radio receiver; FIG. 28 shows the DC offset eliminating circuit illustrated in FIG. 27; and FIG. 29 shows the IQ amplitude imbalance correcting circuit illustrated in FIG. 27.

In FIG. 27, the conventional digital radio receiver is equipped with an antenna 1, an RF/IF converter 2 for converting radio frequencies to intermediate frequencies, an IQ separator 3 for separating I and Q and for issuing differential outputs Ip, Qp, In, and Qn (the suffix of "p" denotes positive; the suffix tn "n" denotes negative), a filter 4 for eliminating a noise such as a radio frequency, a DC offset eliminating circuit 5 for removing a DC offset from an output of the filter 4, an IQ amplitude imbalance correcting circuit 6 for correcting the IQ amplitude imbalance of an output of the DC offset eliminating circuit 5, a multiplying sampler 7 for sampling an output of the IQ amplitude imbalance correcting circuit 6, and a digital signal processing unit 8 comprised mainly of DSP for performing quadrature phase demodulation.

In FIG. 28, the DC offset eliminating circuit 5 is equipped with resistors 9 through 11 and 13, a differential amplifier 12, resistors 14 through 16 and 18, and a differential amplifier 17. It should be noted that two offset eliminating circuits are required because there are two signal lines for I and Q.

In FIG. 29, the IQ amplitude imbalance correcting circuit 6 is equipped with resistors 19 and 20, and variable resistors 21 and 22.

In the elimination of the DC offset by the DC offset eliminating circuit 5, the occurrence of DC can be prevented by subjecting I and Q to differential amplification as illustrated in FIG. 28.

The IQ amplitude imbalance correcting circuit 6 requires adjustment at the time of manufacture if IQ amplitude imbalance is found. The imbalance in the IQ amplitude can be corrected by adjusting the variable resistors 21 and 22 shown in FIG. 29.

In the manufacture of the digital radio receiver which employs the quadrature phase modulator-demodulator, it is difficult to obtain equal I and Q amplitudes and to eliminate the DC offset because of the variations in components. For this reason, manual adjustment is required at the time of manufacture to cope with the IQ amplitude imbalance. In addition, expensive components and large-scale circuits are required to control the variations in the components.

Further, expensive components which exhibit less temperature-dependent change in characteristics are often used or the circuit scale of a temperature compensation circuit tends to grow larger to deal with the temperature changes encountered during actual use. This presents difficulties in achieving compact design and lower cost. In other words, expensive components and large-scale circuits are necessitated to receive intact input signals without depending on temperature changes.

The conventional digital radio receiver described above poses a problem in that the DC offset eliminating circuit 5 and the IQ amplitude imbalance correcting circuit 6 as well as the manual adjustment are required since it is difficult to obtain equal IQ amplitudes and remove the DC offset in the manufacture due to the variations in the components involved.

There is another problem in that the need for the expensive components exhibiting less temperature-dependent changes in characteristics or the temperature compensation circuit to cope with the temperature changes in actual use inevitably leads to higher cost and an increased scale of the circuit.

SUMMARY OF THE INVENTION

The present invention has been accomplished with a view toward solving the problems stated above and it is an object of the present invention to provide a digital radio receiver which eliminates the need for the manual adjustment at the time of manufacture and which is capable of estimating and correcting IQ distortion inexpensively and accurately.

It is another object of the present invention to provide a digital radio receiver which allows the IQ distortion to be corrected without depending on temperature changes encountered during actual operation.

To these ends, according to one aspect of the present invention, there is provided a digital radio receiver which is equipped with receiving means for receiving an input signal and demodulating means for estimating the distortion of the input signal, eliminating the estimated distortion from the input signal to acquire a normal input signal, performing demodulation according to the proper input signal, and issuing the demodulated signal.

According to another aspect of the present invention, there is provided a digital radio receiver, wherein the receiving means includes an antenna for receiving radio frequencies, an RF/IF converter for converting a radio frequency into an intermediate frequency, an IQ separator for separating I and Q from the intermediate frequency, a filter for removing a noise from an output of the IQ separator, and a multiplying sampler for sampling an output of the filter.

According to still another aspect of the present invention, there is provided a digital radio receiver, wherein the demodulating means is a digital signal processing unit which performs quadrature phase demodulation based on the proper input signal.

According to yet another aspect of the present invention, there is provided a digital radio receiver, wherein, when it is guaranteed beforehand that the IQ phases will be orthogonal, the digital signal processing unit divides the data on the quadrature phase demodulated wave, which has been sampled, into groups on a basis of a plurality of IQ coordinates and it estimates the parameters of an elliptical equation passing the plurality of IQ coordinates for each group, verifies the physical validity of the parameters so as to select groups which have valid parameters, averages the parameters of the selected groups, and removes the distortion from the data on the quadrature phase demodulated wave according to the obtained mean values.

According to another aspect of the present invention, there is provided a digital radio receiver, wherein, when the DC offset and the IQ amplitude imbalance are present, the digital signal processing unit divides the sampled data into groups for every four IQ coordinates and it estimates the parameters related to the amplitude and central coordinate of an elliptical equation passing the four IQ coordinates for each group, verifies the physical validity of the parameters to select groups which have valid parameters, averages the parameters of the selected group, determines the IQ amplitude ratio and the DC offset amount according to the obtained mean values, deduct the DC offset amount from the sampled data, and multiplies the obtained value by the IQ amplitude ratio.

According to still another aspect of the present invention, there is provided a digital radio receiver which is equipped with retaining means for retaining the distortion, which is caused by temperature changes and which has been estimated by a test signal beforehand, receiving means for receiving an input signal, and demodulating means for acquiring a proper input signal by eliminating the retained distortion from the input signal, performing demodulation according to the proper input signal, and issuing the demodulated signal.

According to a further aspect of the present invention, there is provided a digital radio receiver, wherein the receiving means includes an antenna for receiving radio frequencies, an RF/IF converter for converting the radio frequencies to intermediate frequencies, an IQ separator for separating I and Q of the intermediate frequencies, a filter for removing noises from an output of the IQ separator, and a multiplying sampler for sampling the outputs of the filter.

According to another aspect of the present invention, there is provided a digital radio receiver, wherein the demodulating means is a digital signal processing unit which performs quadrature phase demodulation according to the proper input signal.

According to still another aspect of the present invention, there is provided a digital radio receiver, wherein the retaining means is a memory for storing distortion data for each temperature change.

According to a further aspect of the present invention, there is provided a digital radio receiver, wherein; prior to actual use, the digital signal processing unit receives data on quadrature modulated wave test signals, which have been sampled for each temperature change, and estimates the distortion of the quadrature modulated wave test signals according to a predetermined algorithm, and the-CPU creates in the memory a table related to the temperatures obtained through the temperature sensor and the estimated distortion data; and in actual use, the CPU retrieves corresponding distortion data from the table by using the temperature detected by the temperature sensor as the clue, then the digital signal processing unit removes the distortion from the input signal in accordance with the retrieved distortion data.

According to yet another aspect of the present invention, there is provided a digital radio receiver which is equipped with a CPU and a temperature sensor for detecting temperature, wherein, if it is guaranteed beforehand that only DC offset will occur, then, prior to actual use, the digital signal processing unit receives the data on quadrature test signals, which have been evenly sampled on a phase plane for each temperature change, and estimates the DC offset by averaging all the obtained I data and Q data, then the CPU prepares in the memory a table related to the temperature obtained from the temperature sensor and the estimated DC offset; in actual use, the CPU retrieves a corresponding estimated DC offset from the table by using the temperature, which has been detected by the temperature sensor, as the clue, then the digital signal processing unit subtracts the estimated DC offset from the input signal in accordance with the estimated DC offset which has been retrieved.

DESCRIPTION OF THE PREFERRED EMBODIMENTS

The first through sixth embodiments of the present invention are designed to compensate the deterioration in an input signal, which is caused by the variations in components and/or devices, by using DSP which is basically intended for demodulating a digital signal. This eliminates the need for adding a dedicated circuit to a regular digital quadrature phase demodulating circuit and it also allows IQ distortion to be estimated and corrected.

The seventh embodiment of the invention includes the temperature sensor and the algorithm for estimating and correcting IQ distortion according to any of the first to sixth embodiments; it conducts the temperature test beforehand at the time of manufacture and prepares a table showing IQ distortion parameters in relation to temperature. In actual use, a corresponding IQ distortion parameter is found from the table by using the temperature information received from the temperature sensor as a clue and the found parameter is set in the correcting algorithm, thereby correcting the IQ distortion. Thus, the IQ distortion can be corrected by estimating the IQ distortion and using the correcting algorithm without depending on the temperature changes during actual operation.

The eighth embodiment of the present invention which is an example employing signals, which are evenly distributed on a phase plane, as the test signals employed for the temperature test when only the DC offset is involved, thereby providing an extremely simplified algorithm for estimating DC offset.

Further, the first through eighth embodiments show different algorithms for different levels of DC offset and IQ amplitude imbalance, and for quadrature IQ phase and non-quadrature IQ phase, so that the best suited algorithm may be selected according to the memory capacity used and DSP processing speed. In the following description of specific embodiments, expressions and formulas recited are shown in of this specification.

First Embodiment:

In the first embodiment in accordance with the present invention, a quadrature phase demodulated wave is generated by detecting a received signal and down-converting it to a baseband signal, and it is guaranteed beforehand that the I and Q phases are orthogonal. The first embodiment samples the demodulated wave, divides the obtained samples into groups for each appropriate IQ4 coordinate, and estimates the parameters related to the amplitude and the central coordinate of an elliptical equation passing the IQ4 coordinate for each group. Then, each parameter is verified for physical validity to select a group which has valid parameters. The parameters of the group are averaged and the obtained mean value is used for the IQ amplitude ratio and the DC offset amount. The DC offset amount is subtracted from the above-mentioned sampled points and the result is multiplied by the amplitude ratio so as to correct the IQ amplitude imbalance and remove the DC offset.

Figure 1:
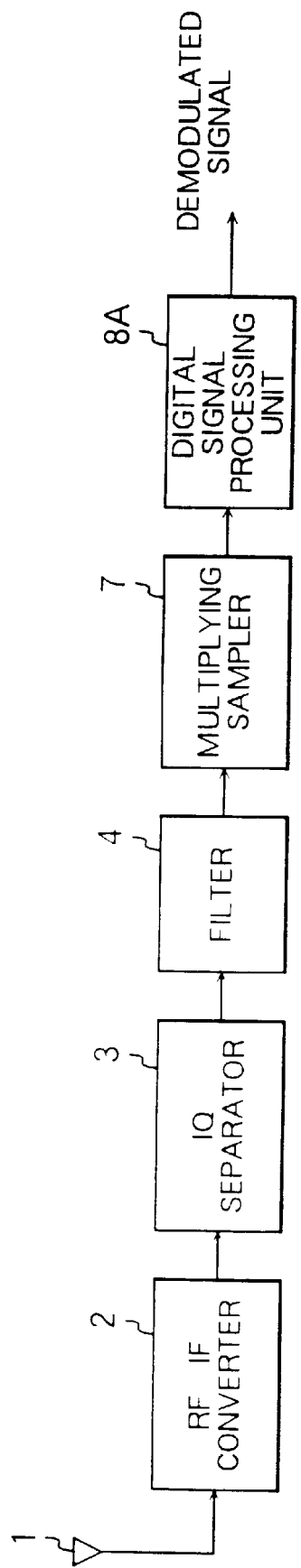
FIG. 1 is a block diagram showing the configuration of a demodulating system of a first embodiment in accordance with the present invention.

The configuration of the first embodiment of the present invention will be described with reference to FIG. 1. FIG. 1 is the block diagram illustrative of the demodulating system of the first embodiment in accordance with the present invention. In the drawings, the same reference numerals denote the same or equivalent components.

In FIG. 1, the digital radio receiver according to the first embodiment is equipped with the antenna 1, the RF/IF converter 2 for converting radio frequencies into intermediate frequencies, the IQ separator 3 for separating I and Q, the filter 4 for removing noises such as radio frequencies, a multiplying sampler 7 for sampling the output of the filter 4, and a digital signal processing unit 8A primarily comprised of a DSP which implements the algorithm, discussed hereinafter, and which also performs quadrature phase demodulation. The multiplying sampler 7 is, for example, a quadruple over sampler. The digital radio receiver is also equipped with a system control CPU which will not be shown.

Figure 2:
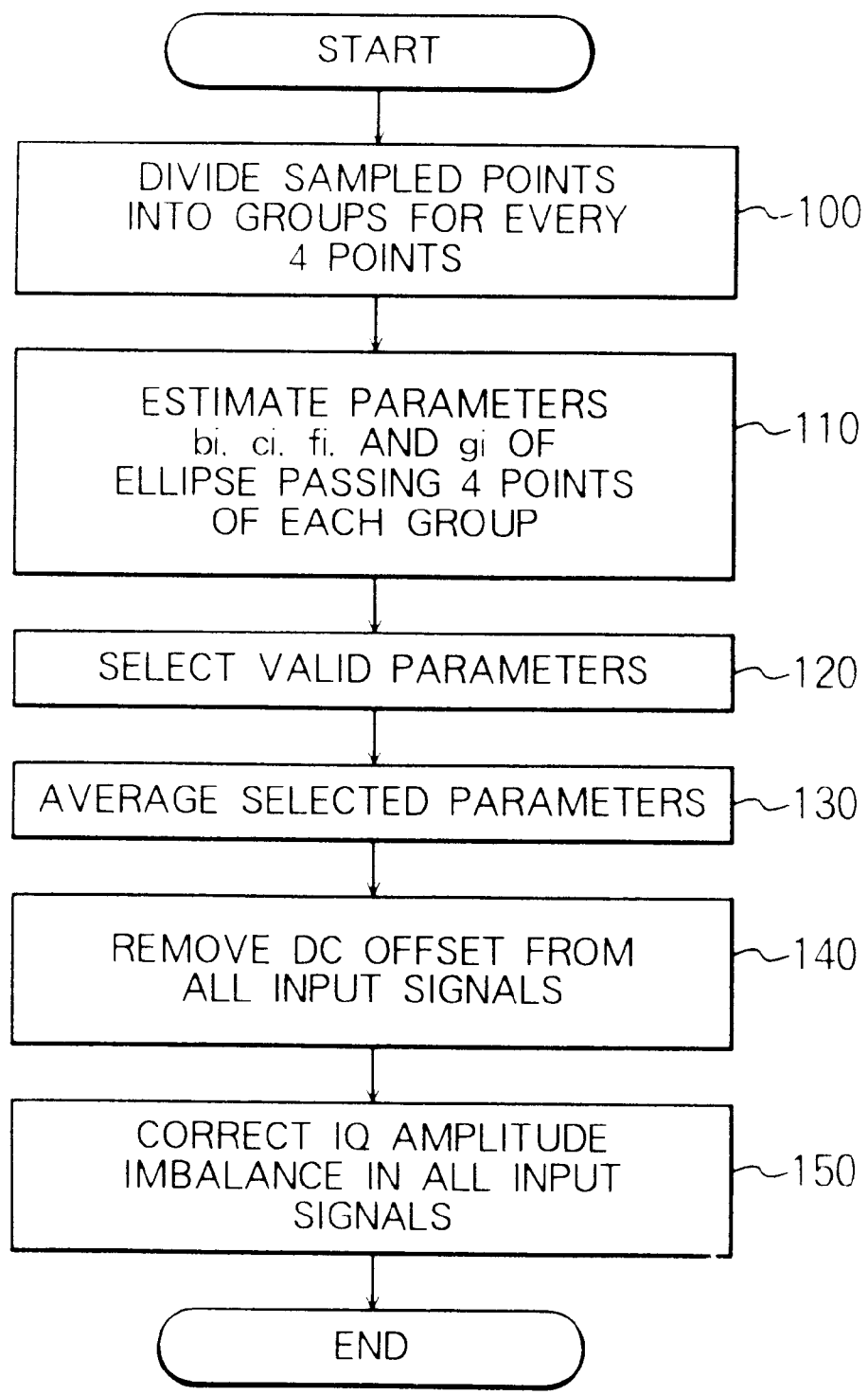
FIG. 2 is a flowchart showing the operation, i.e. algorithm, of a digital signal processing unit according to the first embodiment.
Figure 3:
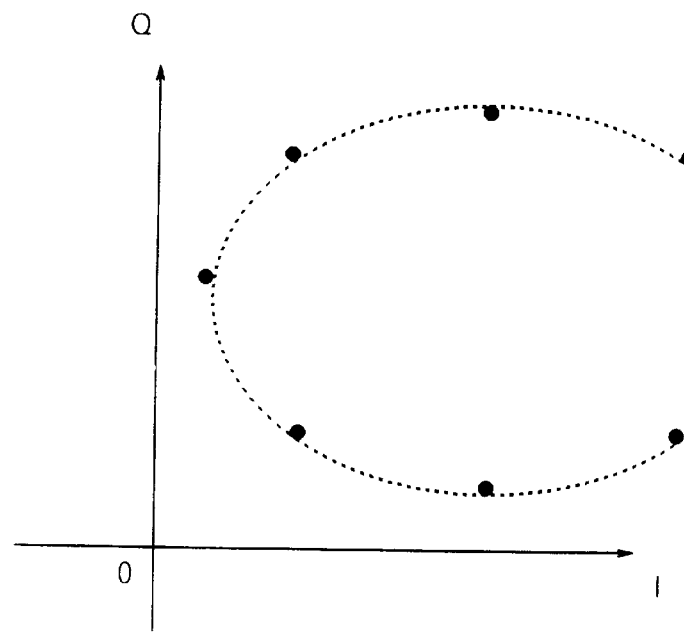
FIG. 3 is a diagram showing a quadrature phase demodulated wave on an IQ plane according to the first embodiment, wherein the I and Q phases are orthogonal and DC offset and IQ amplitude imbalance are present.
Figure 4:
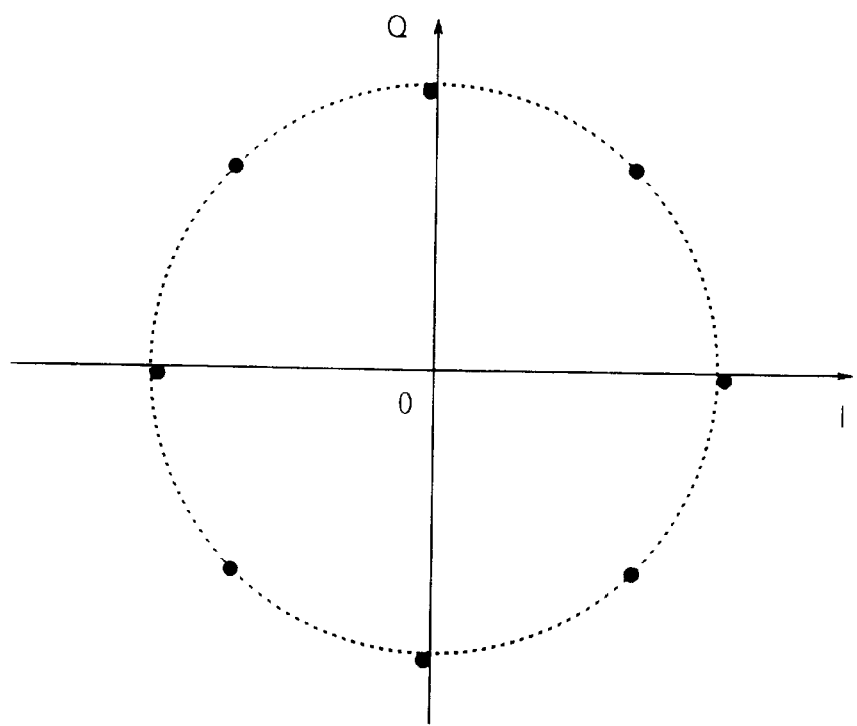
FIG. 4 is a diagram showing a desirable quadrature phase demodulated wave on the IQ plane which is free of IQ distortion according to the first embodiment.

The operation of the first embodiment will now be described with reference to FIG. 2, FIG. 3, and FIG. 4. FIG. 2 is the flowchart showing the operation, i.e. algorithm, of the digital signal processing unit according to the first embodiment. The algorithm is initiated when a power switch or the like is turned ON. FIG. 3 shows the quadrature phase demodulated wave on the IQ plane according to the first embodiment, wherein the I and Q phases are orthogonal, and the DC offset and IQ amplitude imbalance are present. The drawing shows an appropriate number of points and the dotted line is drawn to indicate the shape; the points and dotted lines of a similar drawing will mean the same. FIG. 4 shows a desirable quadrature phase demodulated wave on the IQ plane which is free of IQ distortion.

The first embodiment is designed to down-convert the input signal to the baseband signal through the RF/IF converter 2, filter unnecessary noises through the filter 4, and performs sampling through the quadruple over sampler 7. When it is guaranteed that the I and Q phases are orthogonal, the digital signal processing unit 8A estimates the IQ amplitude imbalance amount and the DC offset amount to correct the input signal.

In a step 100, the digital signal processing unit 8A divides the received IQ data, which has gone through the multiplication over sampling, into groups; more specifically, it divides the data shown in FIG. 3 into groups for every three points so that each group includes four pieces of data, beginning with the head of the input IQ data $(I_j, Q_j)$, where $j=0, \ldots, L-1$, and L denotes the size of the buffer for received IQ data.

The configuration of each group is $\{I_{1i}, I_{2i}, I_{3i}, I_{4i}\}=\{I_i, I_{i+4}, I_{i+8}, I_{i+12}\}$ for channel I and $\{Q_{1i}, Q_{2i}, Q_{3i}, Q_{4i}\}=\{Q_i, Q_{i+4}, Q_{i+8}, Q_{i+12}\}$ for channel Q. The group is denoted by the subscript i; $i=0, \ldots, L-13$.

Other grouping methods than that described above are possible. For instance, measures may be taken so that a factor belonging to a certain group may not become a factor of another group. The grouping method of this embodiment is just an example among other possible methods.

In a step 110, the digital signal processing unit 8A performs the arithmetic operation of the elliptical parameters. The elliptical equation is represented by expression (1) of page 41. It should be noted that conditional expressions (2) and (3) are required. Expression (3), "det" indicates a determinant.

Developing expression (1) leads to expression (4). At this time, substituting four coordinates, namely, $(I_{1i}, Q_{1i})$, $(I_{2i}, Q_{2i})$, $(I_{3i}, Q_{3i})$, and $(I_{4i}, Q_{4i})$ into (I, Q) of expression (4) yields four equations (5), (6), (7), and (8) of pages 41 and 42. Parameters $b_i, c_i, g_i$, and $f_i$ of equations (5), (6), (7), and (8) will be solved. These parameters $b_i, c_i, g_i$, and $f_i$ can be obtained by using expressions (9), (10), (11), (12), and (13)

Then, in a step 120, the digital signal processing unit 8A selects valid values for each of the obtained parameters $b_i, c_i, f_i$, and $g_i$.

First, the digital signal processing unit 8A checks on parameter $b_i$ whether conditional expression (14) is satisfied. If this condition is satisfied, then this parameter is adopted as the data for the averaging step to be implemented hereinafter; if it is not satisfied, then all parameters calculated for this group will be nullified and removed from the averaging process.

In the subsequent step, it is further checked whether {Radius of the ellipse in the direction of axis I}$^2=r_i^2$ stays within a certain range by using expression (15). Just like the above case, if the condition is satisfied, then the parameter is adopted as the data for the averaging step to be implemented hereinafter; if the condition is not satisfied, then all parameters calculated for this group will be nullified and removed from the averaging process. If the above two conditions are satisfied, then conditional formulas (2) and (3) will be automatically satisfied.

Then, expression (16) is used to checked whether there is a predetermined distance between the center of the ellipse and the origin. Just like the above case, if the condition is satisfied, then the parameter is adopted as the data for the averaging step to be implemented hereinafter; if the condition is not satisfied, then all parameters calculated for this group will be nullified and removed from the averaging process.

The verification implemented in the step 120 is a must because the conditional formulas (2) and (3) are the conditions for the ellipse to hold, whereas other conditions may be omitted. More conditions in addition to those stated above may be added.

In a step 130, the digital signal processing unit 8A carries out the averaging process on the groups (hereinafter referred to as "VG") which have the valid parameters selected by the aforesaid arithmetic operation. The averaging operation can be performed by executing formulas (17), (18), and (19) of page 45, taking the total of VGs as N.

In a step 140, the digital signal processing unit 8A subtracts the obtained central $(-g_-, (f^-/b^-))$ coordinate of the ellipse from each received IQ data $(I_j, Q_j)$ according to expression (20) so as to cancel the DC offset. The values after the cancellation are represented by $(I_j', Q_j')$.

The reference characters $b^-$, $f^-$ and $g^-$ indicate the mean values of the respective parameters of formulas (17), (18) and (19).

Next, in a step 150, the digital signal processing unit 8A employs formula (21) to correct the IQ amplitude imbalance according to the data $(I_j', Q_j')$ wherein the DC offset has been cancelled.

The data $(I_{newj}, Q_{newj})$ thus obtained provides the input data which has the DC offset and the IQ amplitude imbalance removed as illustrated in FIG. 4. After that, the digital signal processing unit 8A carries out the quadrature phase demodulation processing on the data $(I_{newj}, G_{newj})$ and outputs a demodulated signal.

Second Embodiment:

In the second embodiment in accordance with the present invention, a quadrature phase demodulated wave is generated by detecting an input signal and down-converting it to a baseband signal, and it is guaranteed beforehand that the I and Q phases are orthogonal, only DC offset will occur, and no or very little IQ amplitude imbalance will occur. The second embodiment samples the demodulated wave, divides the obtained samples into groups for each appropriate IQ3 coordinate, and estimates the parameters related to the central coordinate of a circular equation passing through the IQ3 coordinate for each group. Then, each parameter is verified for physical validity to select groups which have valid parameters. The parameters of the groups are averaged and the obtained mean values are used as the DC offset amount. The DC offset amount is subtracted from the above-mentioned sampled points so as to remove the DC offset.

Figure 5:
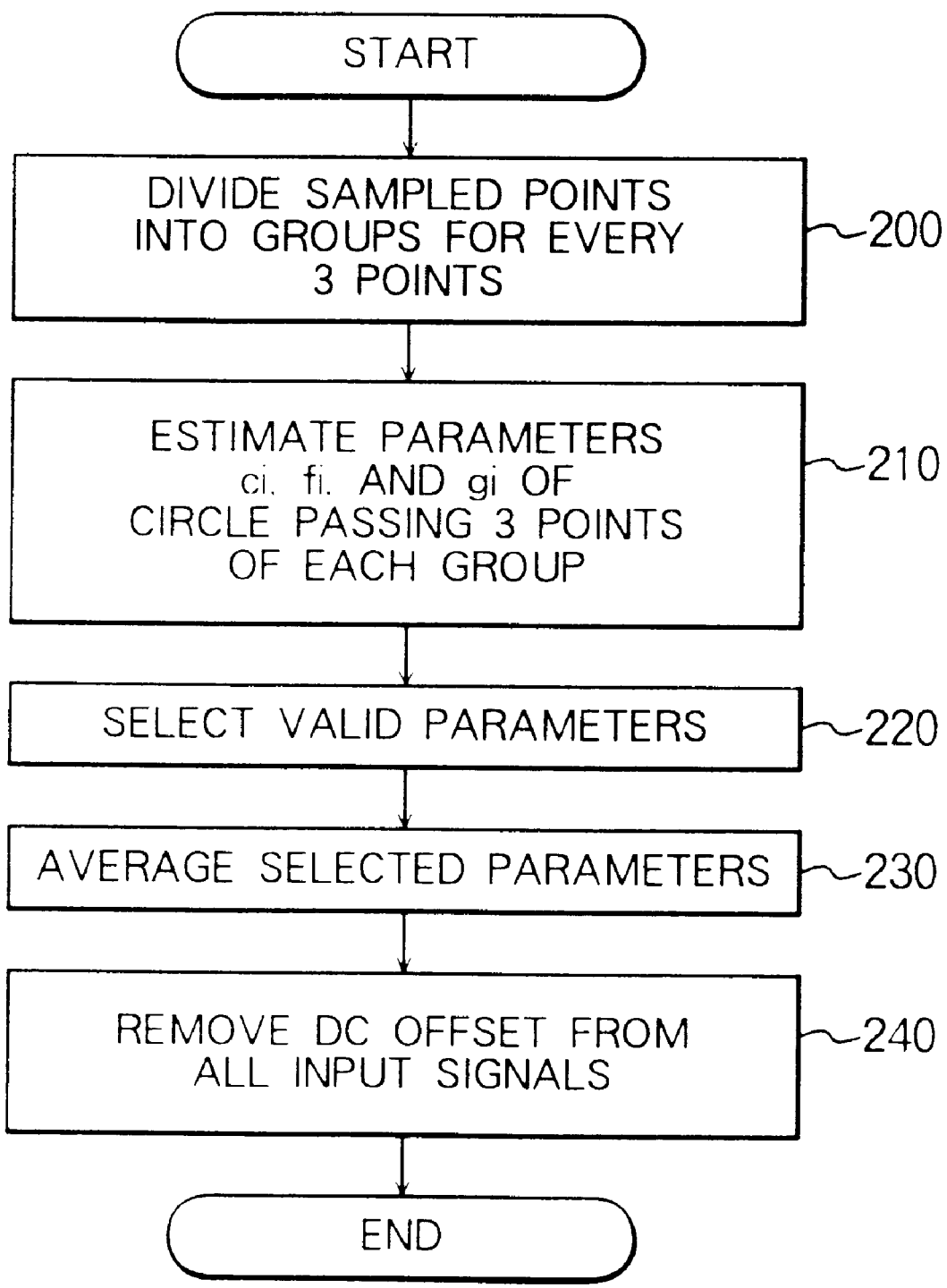
FIG. 5 is a flowchart illustrative of the operation of a digital signal processing unit according to a second embodiment of the present invention.
Figure 6:
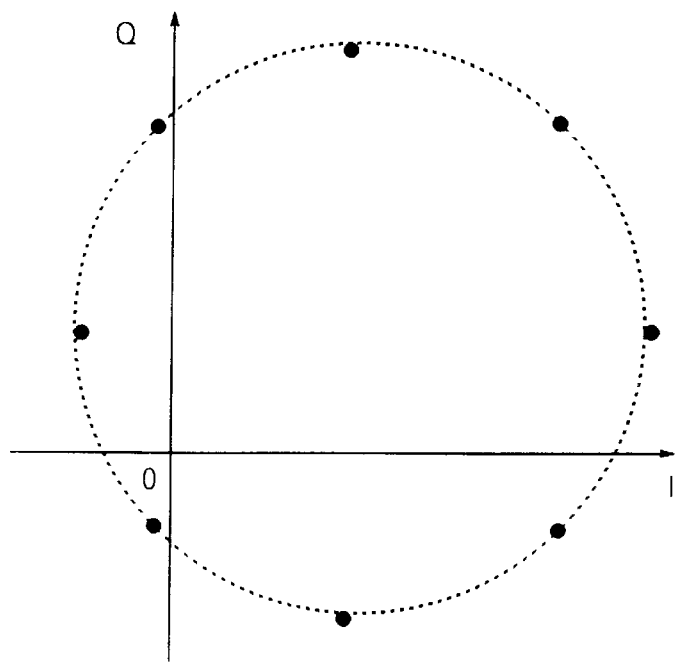
FIG. 6 is a diagram showing a quadrature phase demodulated wave on the IQ plane according to the second embodiment, wherein it is guaranteed beforehand that the I and Q phases are orthogonal, no or very little IQ amplitude imbalance occurs and only DC offset is present.

The second embodiment will now be described with reference to FIG. 5 and FIG. 6. FIG. 5 is the flowchart showing the operation of the digital signal processing unit according to the second embodiment. FIG. 6 shows the quadrature phase demodulated wave on the IQ plane according to the second embodiment, wherein the I and Q phases are orthogonal, and it is guaranteed in advance that no or very little IQ amplitude imbalance will occur and only the DC offset is present. The system configuration is identical to that of the first embodiment shown in FIG. 1.

In a step 200, the digital signal processing unit 8A divides the received IQ data, which has gone through the multiplication over sampling, into groups; more specifically, it divides the data into groups at every three points, so that each group includes three pieces of data, beginning with the head of the input IQ data $(I_j, Q_j)$ shown in FIG. 6, where $j=0, \ldots, L-1$, and L denotes the size of the buffer for received IQ data.

The configuration of each group factor will be $\{I_{1i}, I_{2i}, I_{3i}\}=\{I_i, I_{i+4}, I_{i+8}\}$ for channel I and $\{Q_{1i}, Q_{2i}, Q_{3i}\}=\{Q_i, Q_{i+4}, Q_{i+8}\}$ for channel Q. The group is denoted by the subscript i; $i=0, \ldots, L-9$.

Other grouping methods than that described above are possible. The grouping method of this embodiment is just an example among other possible methods.

In a step 210, the digital signal processing unit 8A performs the arithmetic operation of the circular parameters. The circular equation is represented by expression (22) of page 46. It should be noted that conditional expressions (23) is required.

At this time, substituting three coordinates, namely, $(I_{1i}, Q_{1i})$, $(I_{2i}, Q_{2i})$, and $(I_{3i}, Q_{3i})$, into $(I, Q)$ of expression (22) yields three equations (24), (25), and (26).

The circular parameters can be obtained by using formulas (27), (28), (29), and (30) of pages 47 and 48.

Then, in a step 220, the digital signal processing unit 8A selects valid values for each of the obtained parameters $c_i$, $f_i$, and $g_i$.

First, the digital signal processing unit 8A checks on radius $r_i$ of the circle whether conditional expression (31) is satisfied. At this time, conditional expression (23) is automatically satisfied. If conditional expression (31) is satisfied, then this parameter is adopted as the data for the averaging step to be implemented hereinafter; if it is not satisfied, then all parameters calculated for this group will be nullified and removed from the averaging process.

In the subsequent step, it is further checked whether parameters $f_i$ and $g_i$ satisfy conditional expression (32). Just like the above case, if the condition is satisfied, then the parameters are used as the data for the averaging step to be implemented hereinafter; if they do not satisfy it, then all parameters calculated for this group will be nullified and removed from the averaging process.

In a step 230, the digital signal processing unit 8A carries out the averaging process on the groups which have the valid parameters selected by the aforesaid arithmetic operation (hereinafter referred to as "VG"). The averaging operation can be performed by executing formulas (33) and (34), taking the total of VGs as N.

In a step 240, the digital signal processing unit 8A subtracts the obtained $(-g^-, -f^-)$ coordinate from each input IQ data $(I_j, Q_j)$ according to expression (35) of page 49 so as to cancel the DC offset. The values after the cancellation are represented by $(I_{newj}, Q_{newj})$.

The data $(I_{newj}, Q_{newj})$ thus obtained provides the input data which has the DC offset removed as shown in FIG. 4.

Figure 7:
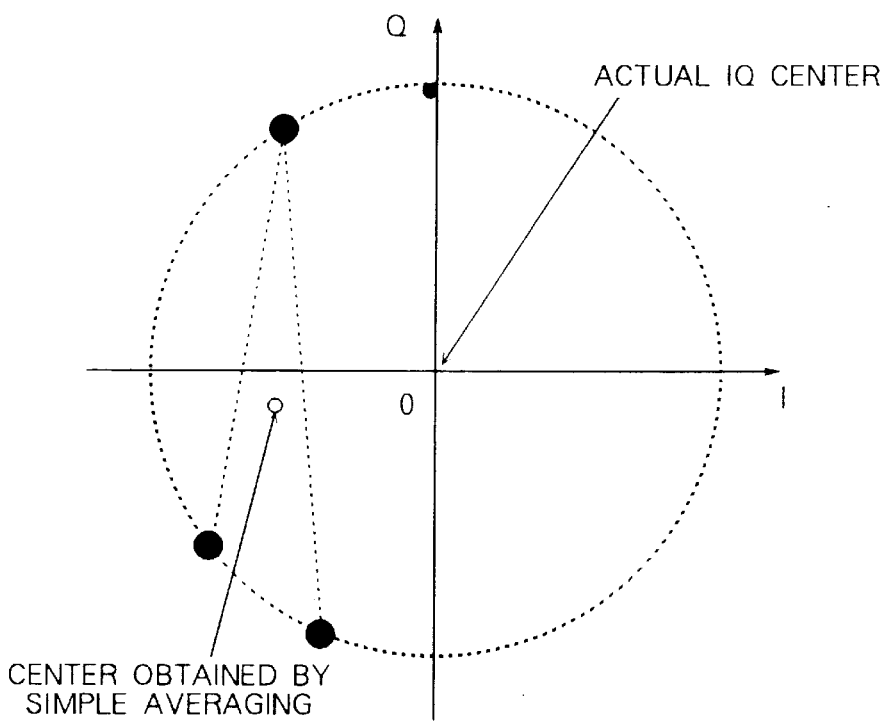
FIG. 7 is a diagram showing the points which have been sampled unevenly on the IQ plane according to the second embodiment.

When only DC offset occurs, a method for simply averaging IQ to estimate the offset amount may be used; however, it would require a great number of sampling points to maintain an acceptable level of accuracy. This is attributable to the fact that a smaller number of sampling points tends to concentrate on one side on the IQ plane as illustrated in FIG. 7. FIG. 7 shows the case wherein the sampling points are concentrated on one side on the IQ plane.

Third Embodiment:

In the third embodiment in accordance with the present invention, a quadrature phase demodulated wave is generated by detecting an input signal and down-converting it to a baseband signal, and it is guaranteed beforehand that the I and Q phases are orthogonal, only amplitude imbalance will occur, and no or very little DC offset will occur. The third embodiment samples the demodulated wave, divides the obtained samples into groups for each appropriate IQ2 coordinate, and estimates the parameters related to the amplitude of an elliptical equation passing through the IQ2 coordinate for each group. Then, each parameter is verified for physical validity to select groups which have valid parameters. The parameters of the groups are averaged and an amplitude ratio is extracted from the obtained mean values. The aforesaid sampled points are multiplied by the obtained amplitude ratio so as to remove the IQ amplitude imbalance.

Figure 8:
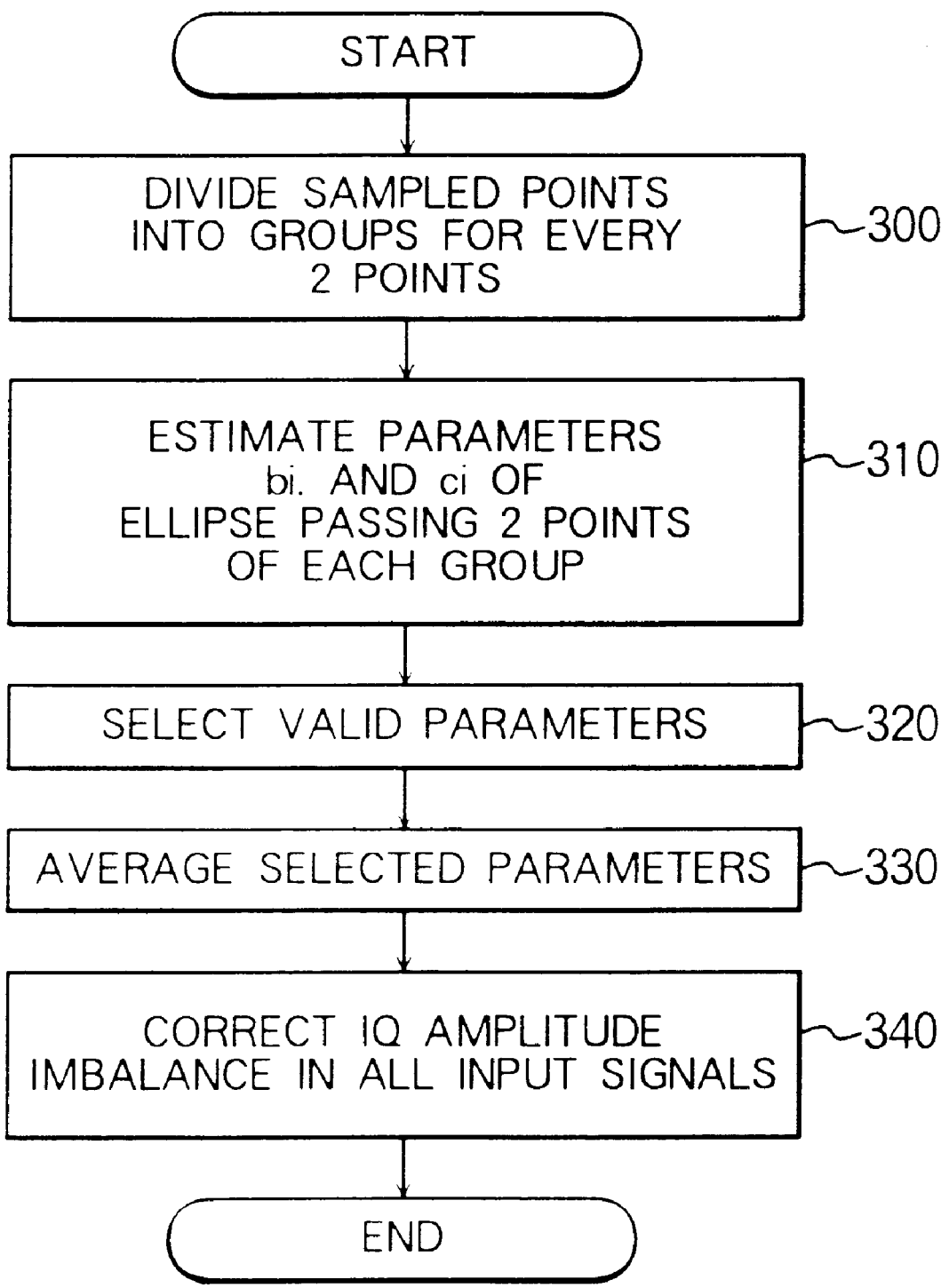
FIG. 8 is a flowchart illustrative of the operation of a digital signal processing unit according to a third embodiment of the present invention.
Figure 9:
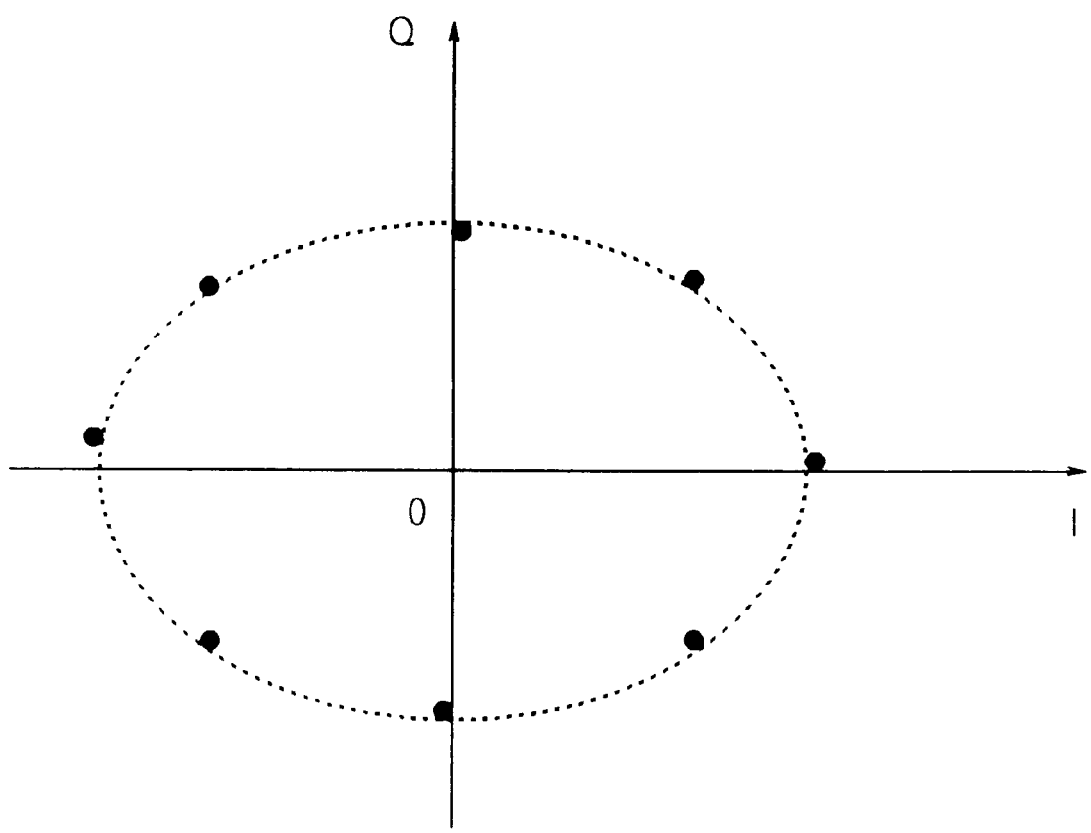
FIG. 9 is a diagram showing a quadrature phase demodulated wave on the IQ plane according to the third embodiment, wherein the I and Q phases are orthogonal, no or very little DC offset occurs and only IQ amplitude imbalance is present.

The third embodiment will now be described with reference to FIG. 8 and FIG. 9. FIG. 8 is the flowchart showing the operation of the digital signal processing unit according to the third embodiment. FIG. 9 shows the quadrature phase demodulated wave on the IQ plane according to the third embodiment, wherein the I and Q phases are orthogonal, no or very little DC offset is present, and only IQ amplitude imbalance is present. The system configuration is identical to that of the first embodiment shown in FIG. 1.

In a step 300, the digital signal processing unit 8A divides the received IQ data, which has gone through the multiplication over sampling, into groups. In this embodiment, the digital signal processing unit 8A divides the data into groups for every two sampled points, beginning with the head of the received IQ data $(I_j, Q_j)$ shown in FIG. 9, where $j=0, \ldots, L-1$, and L denotes the size of the buffer for input IQ data.

The configuration of each group will be $\{I_{1i}, I_{2i}\} = \{I_i, I_{i+4}\}$ for channel I and $\{Q_{1i}, Q_{2i}\} = \{Q_i, Q_{i+4}\}$ for channel Q. The group is denoted by the subscript i; $i=0, \ldots, L-5$.

Other grouping methods than that described above are possible. The grouping method of this embodiment is just an example among other possible methods.

In a step 310, the digital signal processing unit BA calculates the elliptical parameter which has the center thereof at the origin. The elliptical equation is represented by expression (36). It should be noted that conditional expressions (37) is required.

At this time, substituting two coordinates, namely, $(I_{1i}, Q_{1i})$ and $(I_{2i}, Q_{2i})$ into $(I, Q)$ of expression (36) yields two equations (38) and (39).

Parameters $b_i$ and $c_i$ can be obtained by using formulas (40), (41), and (42) of page 50.

Then, in a step 320, the digital signal processing unit 8A checks the obtained parameters $b_i$ and $c_i$ to select valid parameters.

First, the digital signal processing unit 8A checks on parameter $b_i$ whether conditional expression (43) is satisfied. If this condition is satisfied, then the parameter is adopted as the data for the averaging step to be implemented hereinafter; if it is not satisfied, then parameters $b_i$ and $c_i$ calculated for this group will be nullified and removed from the subsequent operation.

In the following step, it is further checked whether parameters $c_i$ satisfies conditional expression (44) of page 51. Just like the above case, if the condition is satisfied, then the parameter is used as the data for the averaging step to be implemented hereinafter; if it does not satisfy the conditional expression, then parameters $b_i$ and $c_i$ calculated for this group will be nullified and removed from the subsequent operation. If the aforesaid two conditions are satisfied, then conditional expression (37) will be automatically satisfied.

In a step 330, the digital signal processing unit 8A carries out the averaging process on the groups which have the valid parameters selected by the aforesaid arithmetic operation (hereinafter referred to as "VG"). The averaging operation can be performed by executing formula (45), taking the total of VGs as N.

In a step 340, the digital signal processing unit 8A calculates expression (46) using the mean value $b^-$ obtained by the above arithmetic operation, thereby removing the IQ amplitude imbalance.

The data $(I_{newj}, Q_{newj})$ thus obtained provides the input data which has the IQ amplitude imbalance corrected as shown in FIG. 4.

Fourth Embodiment:

In the fourth embodiment in accordance with the present invention, a $\pi/4$ shift QPSK demodulated wave is generated by detecting an input signal and down-converting it to a baseband signal, and it is guaranteed beforehand that the I and Q phases are orthogonal, only DC offset will occur, and no or very little IQ amplitude imbalance will occur. The fourth embodiment samples the demodulated wave, calculates the differences among the respective sampled data, establishes one of $(I, Q)=\{K(1, 1), K(1, -1)\}$, where K is an appropriate real number, as the starting point and vector-adds in succession the differences with respect to the vector of the starting point, thereby removing the DC offset.

Figure 10:
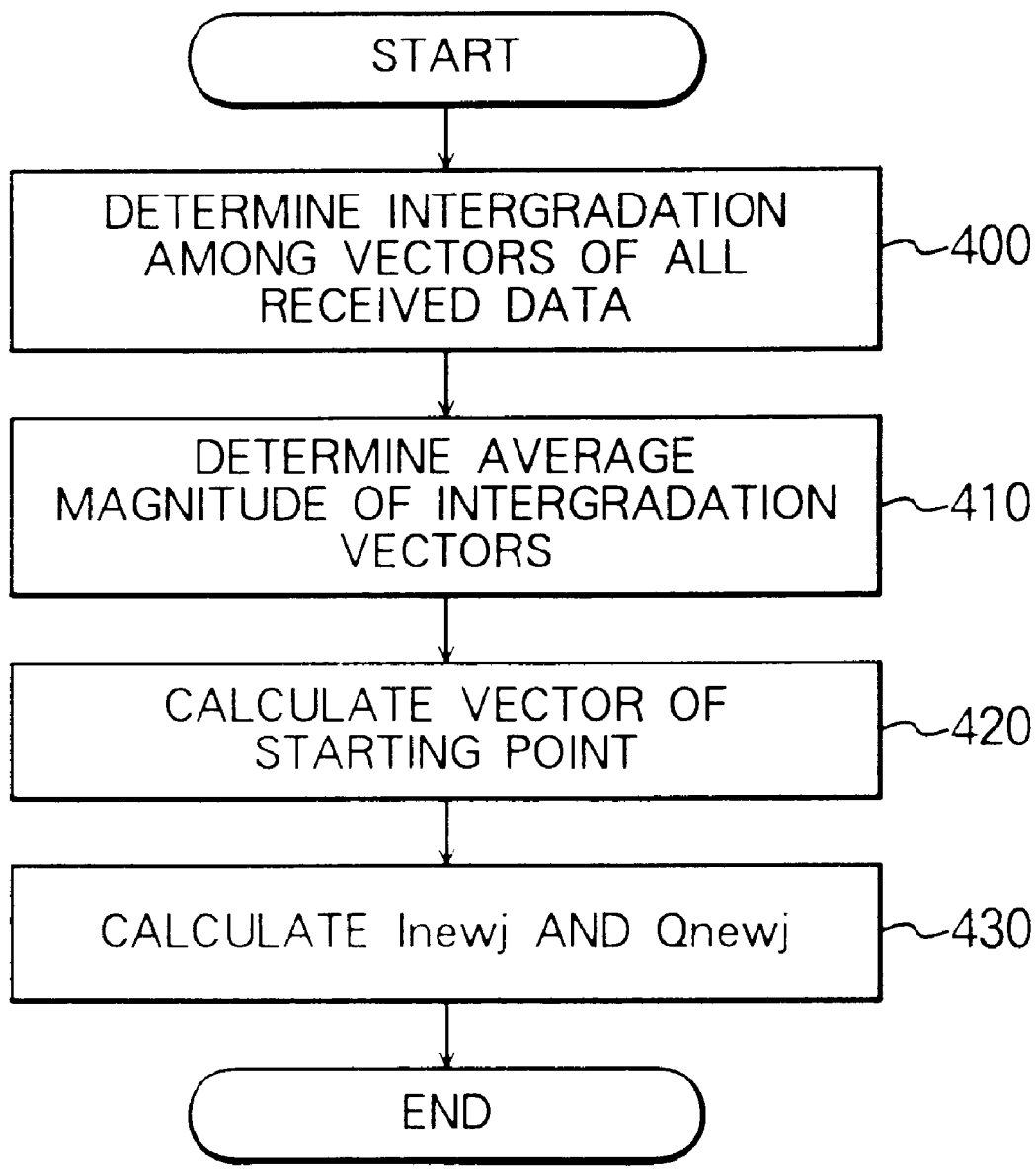
FIG. 10 is a flowchart illustrative of the operation of a digital signal processing unit according to a fourth embodiment of the present invention.
Figure 11:
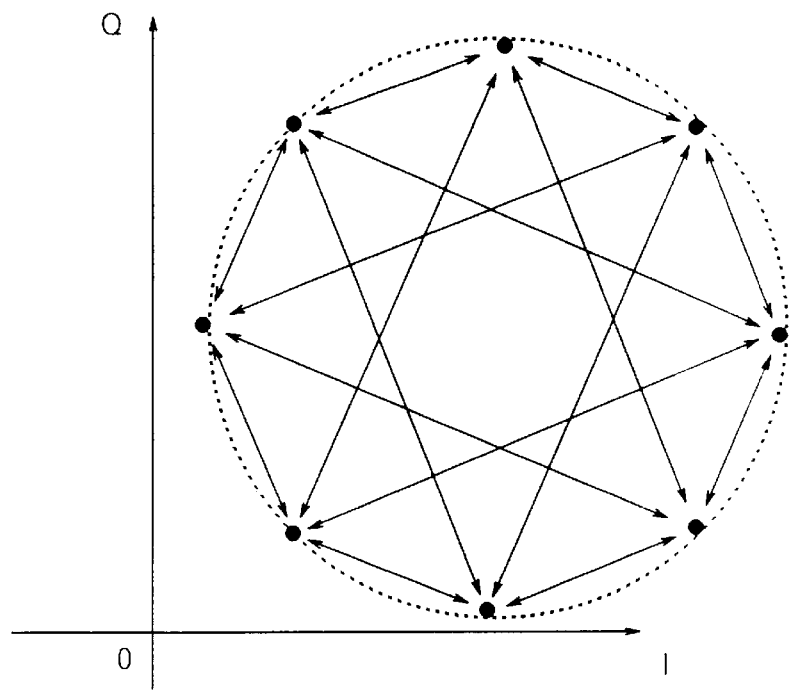
FIG. 11 is a diagram showing a $\pi/4$ shift QPSK demodulated wave on the IQ plane according to the fourth embodiment, wherein the I and Q phases are orthogonal, the IQ amplitudes are balanced, and only the DC offset is present.
Figure 12:
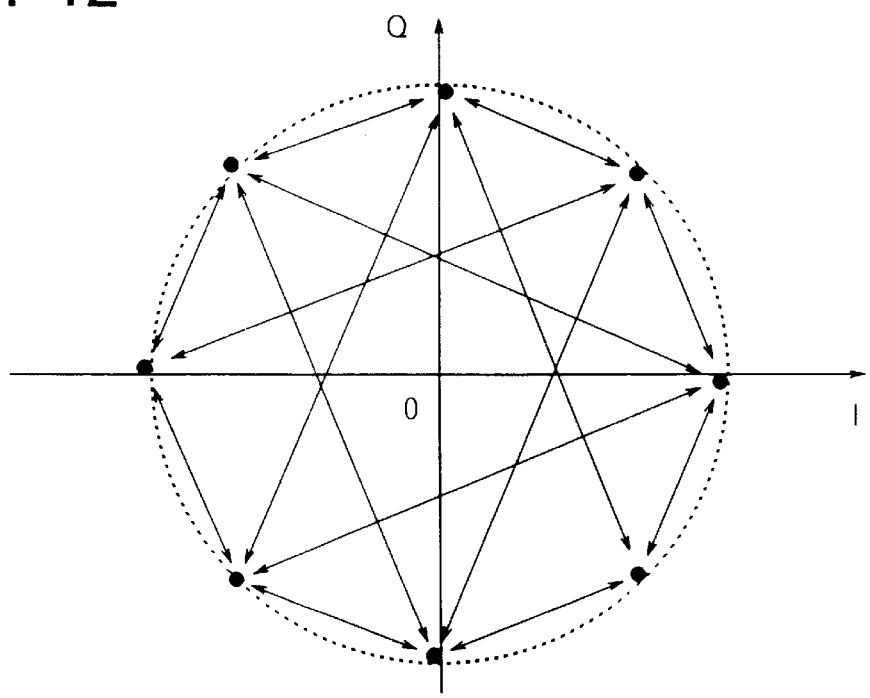
FIG. 12 is a diagram illustrative of a desirable $\pi/4$ shift QPSK demodulated wave on the IQ plane, which is free from IQ distortion, according to the fourth embodiment.

The fourth embodiment will now be described with reference to FIG. 10, FIG. 11, and FIG. 12. FIG. 10 is the flowchart showing the operation of the digital signal processing unit according to the fourth embodiment. FIG. 11 shows the π/4 shift QPSK demodulated wave on the IQ plane according to the fourth embodiment, wherein the I and Q phases are orthogonal, the I and Q amplitudes are balanced, and only DC offset is present. FIG. 12 illustrates a desirable π/4 shift QPSK demodulated wave on the IQ plane which is free of the IQ distortion. The system configuration is identical to that of the first embodiment shown in FIG. 1 except that the receiver employs the π/4 shift QPSK, that is, only the algorithm and the pattern of a signal received through the antenna are different.

In a step 400, the digital signal processing unit 8A determines the differences among the sampled points of the input IQ data (FIG. 11) obtained by the aforesaid multiplication over sampling. The differences can be determined by using expression (47). In the vector ($I_{diffj}$, $Q_{diffj}$) of the aforesaid expression (47), the influences of the DC offset which is already stationary are eliminated.

In a step 410, the digital signal processing unit 8A determines the average magnitude of the vector ($I_{diffj}$, $Q_{diffj}$). The average magnitude can be obtained from expression (48).

In a step 420, the digital signal processing unit 8A determines the starting point vector; specifically, it calculates ($I_{newj}$, $Q_{newj}$), taking "(round×norm)/F√2·(1,1)" as the starting point.

As shown in FIG. 12, the π/4 shift QPSK intergradation vector having the magnitude of $\sqrt{\{(4-2\sqrt{2})/2\}}$ and the one having the magnitude of $\sqrt{\{(4+2\sqrt{2})/2\}}$ emerge at an equal probability. Therefore, "round"=$[\sqrt{\{(4-2\sqrt{2})/2\}}+\sqrt{\{(4+2\sqrt{2})/2\}}]/2 \approx 1.30656$.

The vector which provides the starting point may be any of the four vectors: "(round×norm)/√2·(1,1)", "(round×norm)/√2·(-1,1), (round×norm)/√2·(-1,1)", and "(round×norm)/√2·(-1,-1)". In this embodiment, "(round×norm)/√2·(1,1)" is employed.

In a step 430, the digital signal processing unit 8A obtains the data which has the DC offset removed. Specifically, the data ($I_{newj}$, $Q_{newj}$) can be acquired by implementing expressions (49) and (50) of page 52. The data thus obtained ($I_{newj}$, $Q_{newj}$) provides the signal with the steady DC offset cancelled as shown in FIG. 12.

Fifth Embodiment:

In the fifth embodiment in accordance with the present invention, an input signal is detected and down-converted to a baseband signal to generate a quadrature phase demodulated wave; the I and Q phases are not orthogonal; and the DC offset and IQ amplitude imbalance are present. The fifth embodiment samples the demodulated wave, divides the obtained samples into groups for each appropriate IQ5 coordinate, and estimates the parameters related to an elliptical equation passing the IQ5 coordinate for each group. Then, each parameter is verified for physical validity to select groups which have valid parameters. The parameters of the groups are averaged and the DC offset amount is estimated from the obtained mean values. The DC offset amount is then subtracted from the aforesaid sampled input data, a correct phase angle is estimated from the mean values of the valid parameters, and the point corresponding to the phase angle is relocated on the circumference of radius "1", thereby correcting the IQ amplitude imbalance, non-orthogonal IQ phases, and the DC offset.

Figure 13:
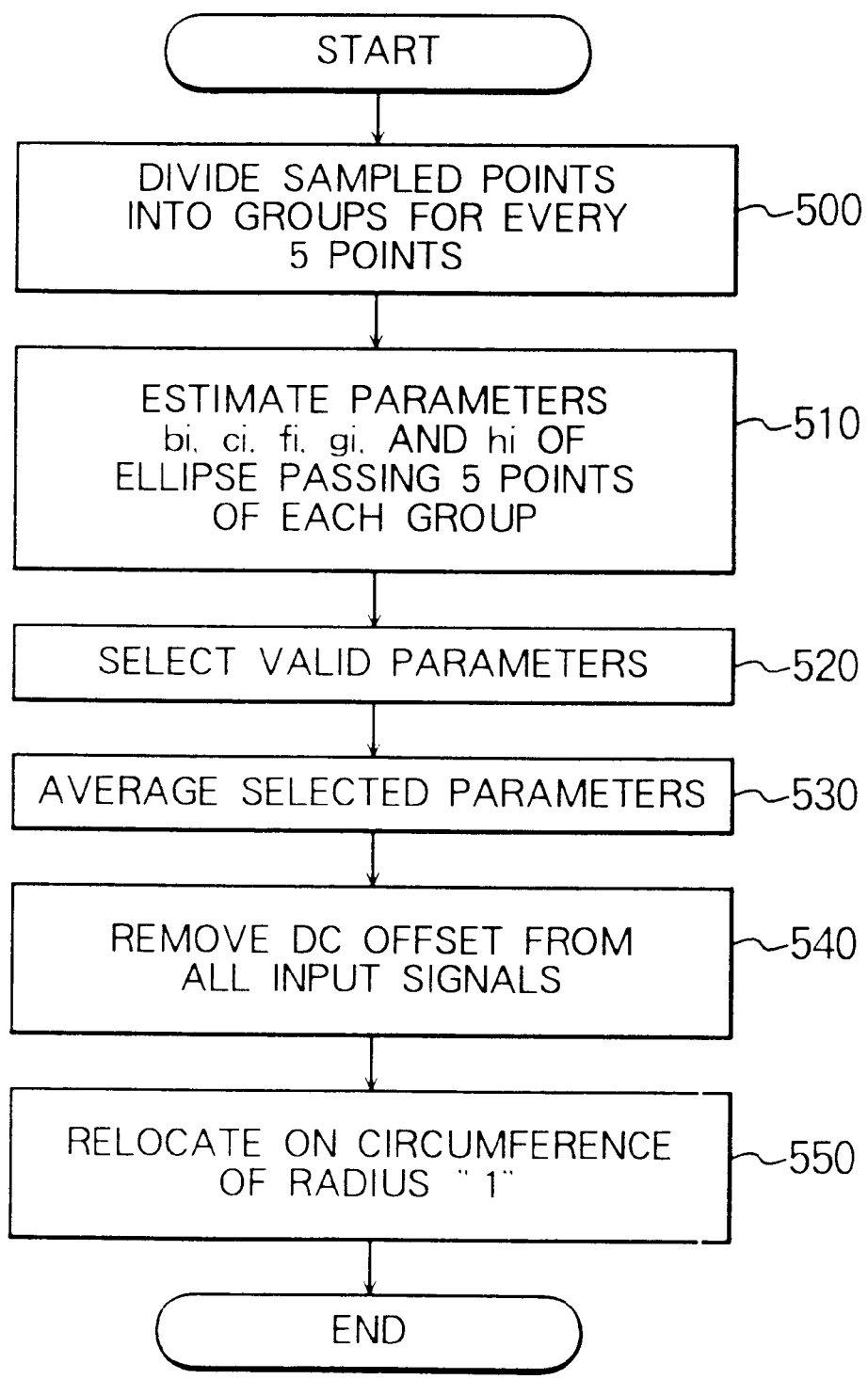
FIG. 13 is a flowchart illustrative of the operation of a digital signal processing unit according to a fifth embodiment of the present invention.
Figure 14:
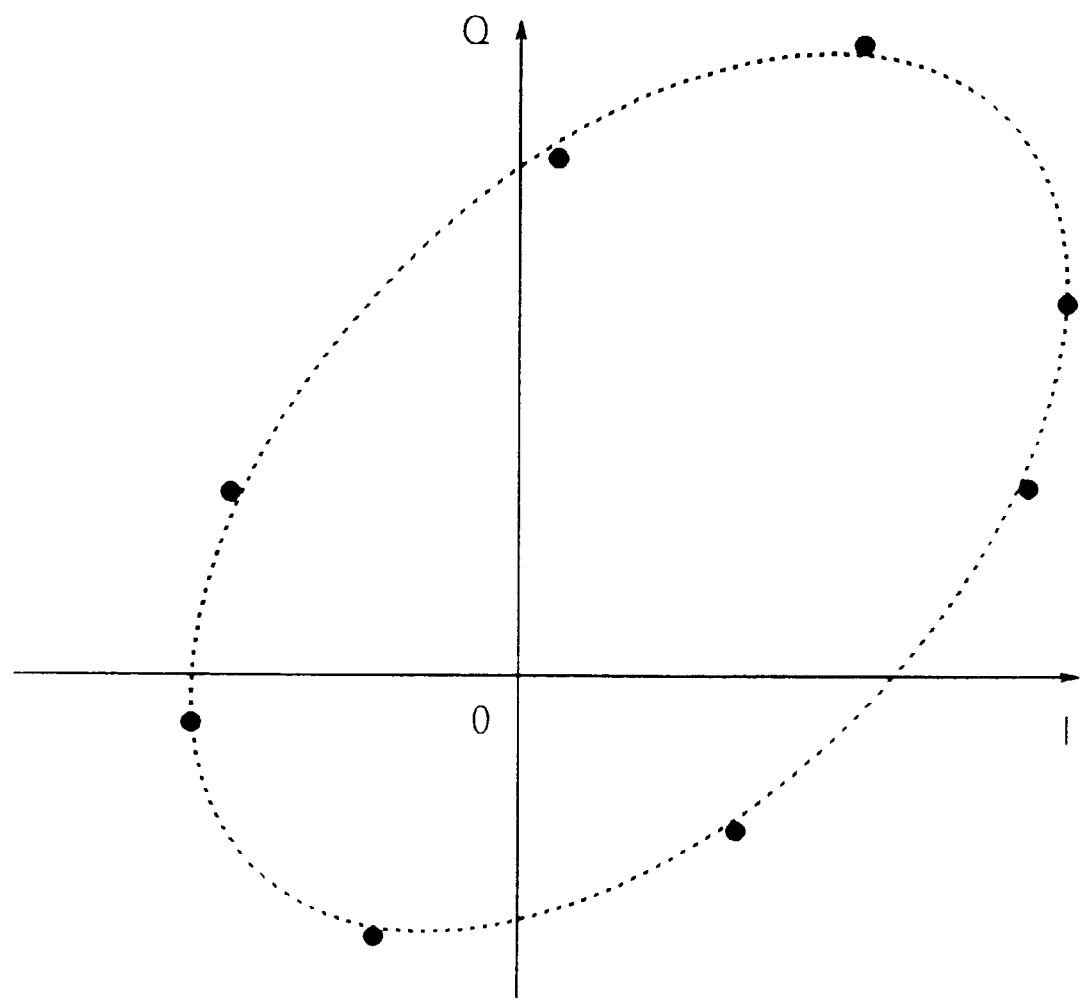
FIG. 14 is a diagram showing a quadrature phase demodulated wave on the IQ plane according to the fifth embodiment, wherein the orthogonalization of I and Q is not guaranteed and IQ amplitude imbalance and DC offset are present.

The operation of the fifth embodiment will now be described with reference to FIG. 13 and FIG. 14. FIG. 13 is the flowchart showing the operation of the digital signal processing unit according to the fifth embodiment. FIG. 14 shows the quadrature phase demodulated wave on the IQ plane according to the fifth embodiment, wherein it is not guaranteed that the I and Q phases are orthogonal, whereas the IQ amplitude imbalance and the DC offset are present. The system configuration is the same as that of the first embodiment shown in FIG. 1.

In a step 500, the digital signal processing unit 8A divides the received IQ data, which has gone through the multiplication over sampling, into groups. In this embodiment, the digital signal processing unit 8A divides the data every three points so that each group includes five pieces of data, beginning with the head of the input IQ data ($I_j$, $Q_j$) as shown in FIG. 14, where j=0, . . . , L-1, and L denotes the size of the buffer for received IQ data.

The configuration of each group will be $\{I_{1i}, I_{2i}, I_{3i}, I_{4i}, I_{5i}\}=\{I_i, I_{i+4}, I_{i+8}, I_{i+12}, I_{i+16}\}$ for channel I and $\{Q_{1i}, Q_{2i}, Q_{3i}, Q_{4i}, Q_{5i}\}=\{Q_i, Q_{i+4}, Q_{i+8}, Q_{i+12}, Q_{i+16}\}$ for channel Q. The group is denoted by the subscript i; i=0, . . . , L-17.

Other grouping methods than that described above are possible. The grouping method of this embodiment is just an example among other possible methods.

In a step 510, the digital signal processing unit 8A performs the arithmetic operation of the elliptical parameters. The elliptical equation is represented by expression (51). It should be noted that conditional expressions (52) and (53) are required.

Computing the left side of expression (51) yields expression (54) of page 53. Substituting ($I_{1i}$, $Q_{1i}$), ($I_{2i}$, $Q_{2i}$), ($I_{3i}$, $Q_{3i}$), ($I_{4i}$, $Q_{4i}$), and ($I_{5i}$, $Q_{5i}$) into I and Q of expression (54) yields expressions (55), (56), (57), (58), and (59).

Then, expressions (55), (56), (57), (58), and (59) are solved in relation to parameters $b_i$, $c_i$, $f_i$, $g_i$, and $h_i$. The exact solutions can be obtained by expressions (60), (61), (62), (63), (64), and (65) however, enormous computation would be involved. Hence, the Gauss-Seidel method, the gradient method, or the like may be used.

Then, in a step 520, the digital signal processing unit 8A selects valid values for each of the obtained parameters $b_i$, $c_i$, $f_i$, $g_i$, and $h_i$. The digital signal processing unit 8A checks whether conditional expression (52) is satisfied. If this condition is satisfied, then this parameter is adopted as the data for the averaging step to be implemented hereinafter; if it is not satisfied, then all parameters calculated for this group will be nullified and removed from the averaging process.

Further, conditional expression (66) of page 56 is checked in relation to parameter $b_i$. Just like the above case, if the condition is satisfied, then the parameter is adopted as the data for the averaging process to be implemented hereinafter; if it is not satisfied, then all parameters calculated for this group will be nullified and removed from the averaging process.

In the following step, it is checked by using conditional expression (67) whether {Radius in the direction of axis I}$^2$=$r_i^2$ of the ellipse stays within a certain appropriate range.

Just like the above case, if the condition is satisfied, then the parameter is adopted as the data for the averaging step to be implemented hereinafter; if the condition is not satisfied, then all parameters calculated for this group will be nullified and removed from the averaging process. If the above conditional expression (67) is satisfied, then conditional expression (53) will be automatically satisfied.

Then, expression (68) is used to checked whether the distance to the center of the ellipse is not more than a predetermined value. Just like the above case, if the condition is satisfied, then the parameter is adopted as the data for the averaging step to be implemented hereinafter; if the condition is not satisfied, then all parameters calculated for this group will be nullified and removed from the averaging process.

In a step 530, the digital signal processing unit 8A carries out the averaging process on the groups (hereinafter referred to as "VG") which have the valid parameters selected by the aforesaid arithmetic operation. The averaging operation can be performed by executing formulas (69), (70), (71), (72), and (73) of pages 56 and 57, taking the total of VGs as N.

In a step 540, the digital signal processing unit 8A subtracts the obtained elliptical center vector $1/(h_i^2-b_i)\cdot(b_ig_i-f_ih_i, f_i-g_ih_i)$ from each piece of input IQ data $(I_j, Q_j)$ according to expression (74) so as to cancel the DC offset. The values after the cancellation are represented by $(I_j', Q_j')$.

Next, in a step 550, the digital signal processing unit 8A relocates the data $(I_j', Q_j')$ on the circumference of radius "1". In other words, the data $(I_j', Q_j')$ with the DC offset cancelled can be represented by expression (75) of page 58 by using angle $\theta_j$ at the time of modulation. Mapping at correct phase points on the circumference of radius "1" is enabled by $(I_{newj}', Q_{newj}')=(\cos\theta_j, \sin\theta_j)$ The computation using expression (76) is performed. The data $(I_{newj}', Q_{newj}')$ thus obtained provides the input data which has the DC offset and the IQ amplitude imbalance removed and the IQ phase difference properly corrected to $\pi/4$ as illustrated in FIG. 4.

Sixth Embodiment:

In the sixth embodiment in accordance with the present invention, an input signal is detected and down-converted to a baseband signal to generate a quadrature phase demodulated wave; the I and Q phases are not orthogonal, the DC offset is absent, and the IQ amplitude imbalance is present. The sixth embodiment samples the demodulated wave, divides the obtained samples into groups for each appropriate IQ3 coordinate, and estimates the parameters of an elliptical equation passing the IQ3 coordinate for each group. Then, each parameter is verified for physical validity to select groups which have valid parameters. The parameters of the groups are averaged and a correct phase angle is estimated from the obtained mean values. The IQ amplitude imbalance and the non-orthogonal I and Q phases are corrected by relocating the point, which corresponds to the aforesaid estimated phase angle, on the circumference of radius "1".

Figure 15:
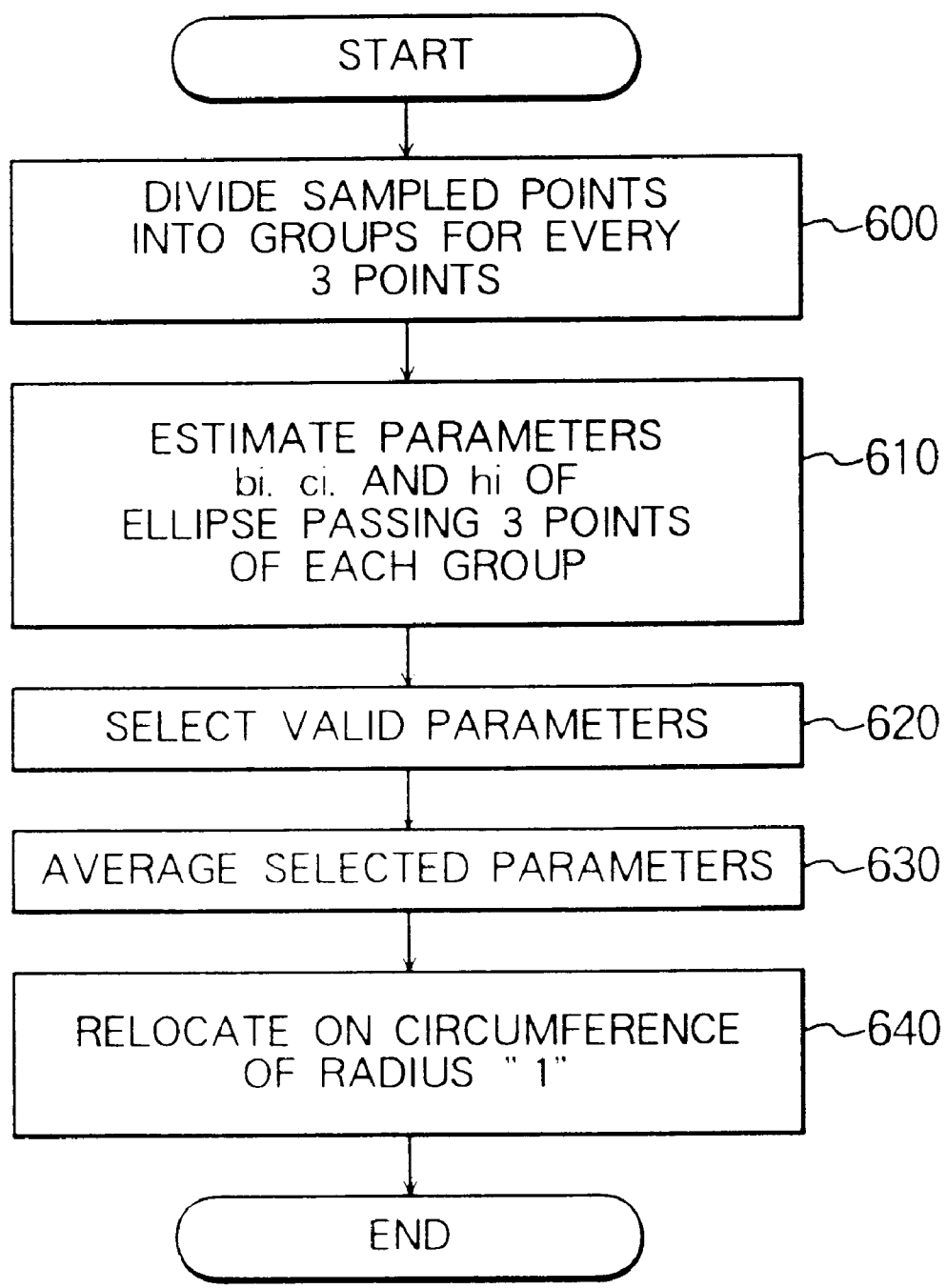
FIG. 15 is a flowchart illustrative of the operation of a digital signal processing unit according to a sixth embodiment of the present invention.
Figure 16:
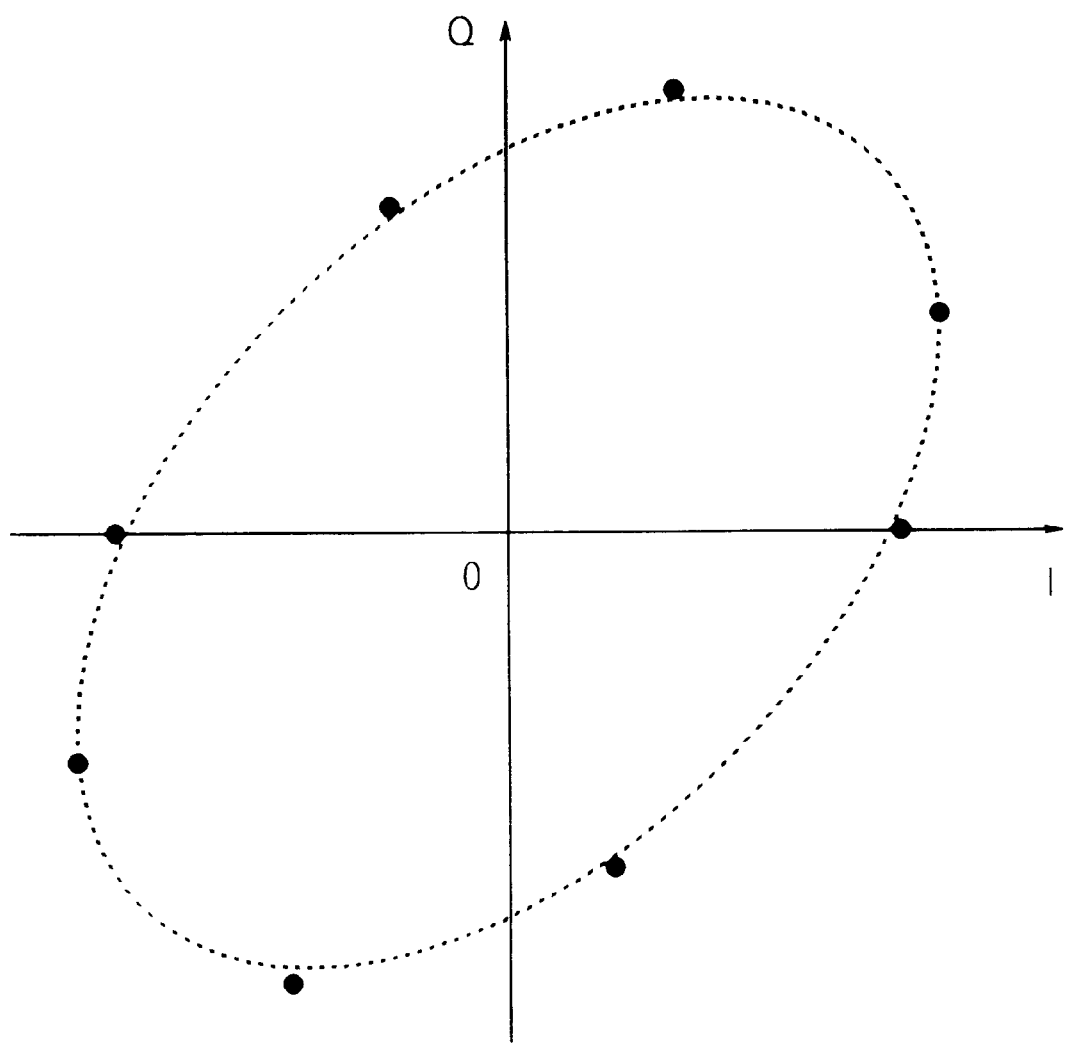
FIG. 16 is a diagram showing a quadrature phase demodulated wave on the IQ plane according to the sixth embodiment, wherein it is guaranteed beforehand that no or very little DC offset occurs in I and Q, the phases are not orthogonal, and IQ amplitude imbalance is present.

The sixth embodiment will now be described with reference to FIG. 15 and FIG. 16. FIG. 15 is the flowchart showing the operation of the digital signal processing unit according to the sixth embodiment. FIG. 16 shows the quadrature phase demodulated wave on the IQ plane according to the sixth embodiment, wherein it is guaranteed in advance that no or very little IQ DC offset will occur, the I and Q phases are not orthogonal, and the IQ amplitude imbalance is present. The system configuration is the same as that of the first embodiment shown in FIG. 1.

In a step 600, the digital signal processing unit 8A divides the received IQ data, which has gone through the multiplication over sampling, into groups. In this embodiment, the digital signal processing unit 8A divides the data into groups every three points so that each group includes three pieces of data, beginning with the head of the input IQ data $(I_j, Q_j)$ as shown in FIG. 16, where j=0, . . . , L-1, and L denotes the size of the buffer for received IQ data.

The configuration of each group will be $\{I_{1i}, I_{2i}, I_{3i}\}=\{I_i, I_{i+4}, I_{i+8}\}$ for channel I and $\{Q_{1i}, Q_{2i}, Q_{3i}\}=\{Q_i, Q_{i+4}, Q_{i+8}\}$ for channel Q. The group is denoted by the subscript i; i=0, . . . , L-9.

Other grouping methods than that described above are possible. The grouping method of this embodiment is just an example among other possible methods.

In a step 610, the digital signal processing unit 8A performs the arithmetic operation of the elliptical parameters. The elliptical equation is represented by expression (77). It should be noted that conditional expressions (78) and (79) are required.

Computing the left side of expression (77) yields expression (80) of page 59. Substituting $(I_{1i}, Q_{1i})$, $(I_{2i}, Q_{2i})$, and $(I_{3i}, Q_{3i})$ into I and Q of expression (80) yields expressions (81), (82) and (83).

Then, expressions (81), (82) and (83) are solved in relation to parameters $b_i$, $c_i$, and $h_i$. The parameters $b_i$, $c_i$, and $h_i$ can be obtained by expressions (84), (85), (86) and (87).

Then, in a step 620, the digital signal processing unit 8A selects valid values for each of the obtained parameters $b_i$, $c_i$, and $h_i$. The digital signal processing unit 8A checks whether conditional expression (78) is satisfied. If this condition is satisfied, then this parameter is adopted as the data for the averaging step to be implemented hereinafter; if it is not satisfied, then all parameters calculated for this group will be nullified and removed from the averaging process.

Further, conditional expression (88) is checked in relation to parameter $b_i$. Just like the above case, if the condition is satisfied, then the parameter is adopted as the data for the averaging process to be implemented hereinafter; if it is not satisfied, then all parameters calculated for this group will be nullified and removed from the averaging process.

In the following step, it is checked whether {Radius in the direction of axis I}$^2=-c_i$ of the ellipse stays within an appropriate range by using conditional expression (89) of page 61. Just like the above case, if the condition is satisfied, then the parameter is adopted as the data for the averaging step to be implemented hereinafter; if the condition is not satisfied, then all parameters calculated for this group will be nullified and removed from the averaging process. If the above conditional expression (89) is satisfied, then conditional expression (79) will be automatically satisfied.

In a step 630, the digital signal processing unit 8A carries out the averaging process on the groups (hereinafter referred to as "VG") which have the valid parameters selected by the aforesaid arithmetic operation. The averaging operation can be performed by executing formulas (90), (91), and (92), taking the total of VGs as N.

In a step 640, the digital signal processing unit 8A relocates the data $(I_j, Q_j)$ on the circumference of radius "1". In other words, the original sampled data $(I_j, Q_j)$ can be represented by expression (93) by using angle $\theta_j$ at the time of modulation. Mapping at correct phase points on the circumference of radius "1" is enabled by $(I_{newj}, Q_{newj})=(\cos\theta_j, \sin\theta_j)$.

The computation using expression (94) of page 62 is performed. The data $(I_{newj}, Q_{newj})$ thus obtained provides the input data which has the IQ amplitude imbalance removed and the IQ phase difference properly corrected to $\pi/4$ as illustrated in FIG. 4.

Seventh Embodiment:

The seventh embodiment according to the present invention includes an algorithm for estimating and correcting IQ distortion and a temperature sensor. Prior to actual use, that is, during the manufacture, the digital radio receiver is subjected to temperature changes and a quadrature modulated wave, which provides a test signal, is supplied through an antenna terminal thereof. At this time, a table is prepared which is related to the temperatures detected through the temperature sensor and the IQ distortions which can be estimated using the aforesaid estimating algorithm. In actual use, a corresponding IQ distortion value is retrieved from the table, using the temperature detected through the temperature sensor as the clue, and the value is set in the correcting algorithm to correct the IQ distortion. The IQ distortion refers to the DC offset, the IQ amplitude imbalance, or the non-orthogonal IQ phases which have been described in the embodiments above.

Figure 17:
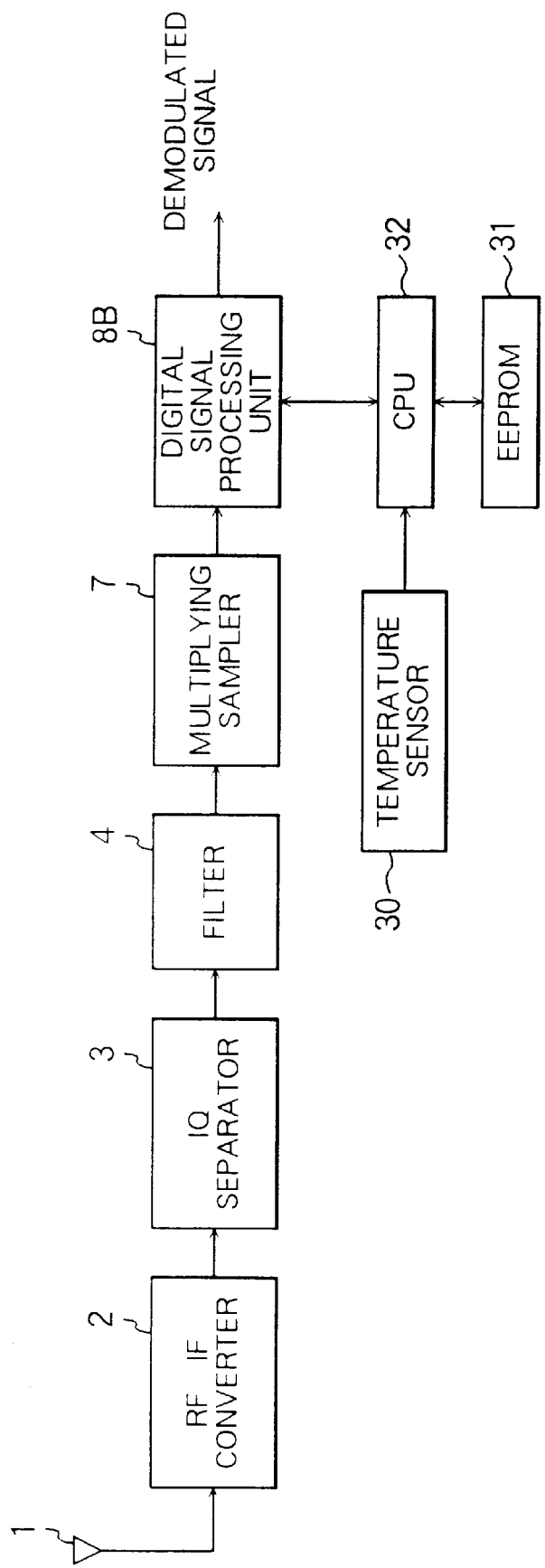
FIG. 17 is a block diagram showing the configuration of a demodulating system of a seventh embodiment of the present invention.

The configuration of the seventh embodiment will now be described with reference to FIG. 17. FIG. 17 is the block diagram showing the configuration of a demodulating system of the seventh embodiment in accordance with the present invention.

In FIG. 17, a digital radio receiver according to the seventh embodiment is equipped with the antenna 1, the RF/IF converter 2 for converting radio frequencies to intermediate frequencies, the IQ separator 3 for separating I and Q, the filter 4 for removing noises such as high frequencies, the multiplying sampler 7 for sampling the output of the filter 4, a digital signal processing unit 8B which implements the algorithm to be discussed below and which is comprised primarily of the DSP for performing quadrature phase demodulation, a temperature sensor 30 for detecting temperature, an EEPROM 31 for storing the table, and a CPU 32 for accessing the table. The multiplying sampler 7 is a quadruple over sampler, for example. The CPU 32 controls the system and it is responsible for man-machine interface control and the timing control for the circuits.

Figure 18:
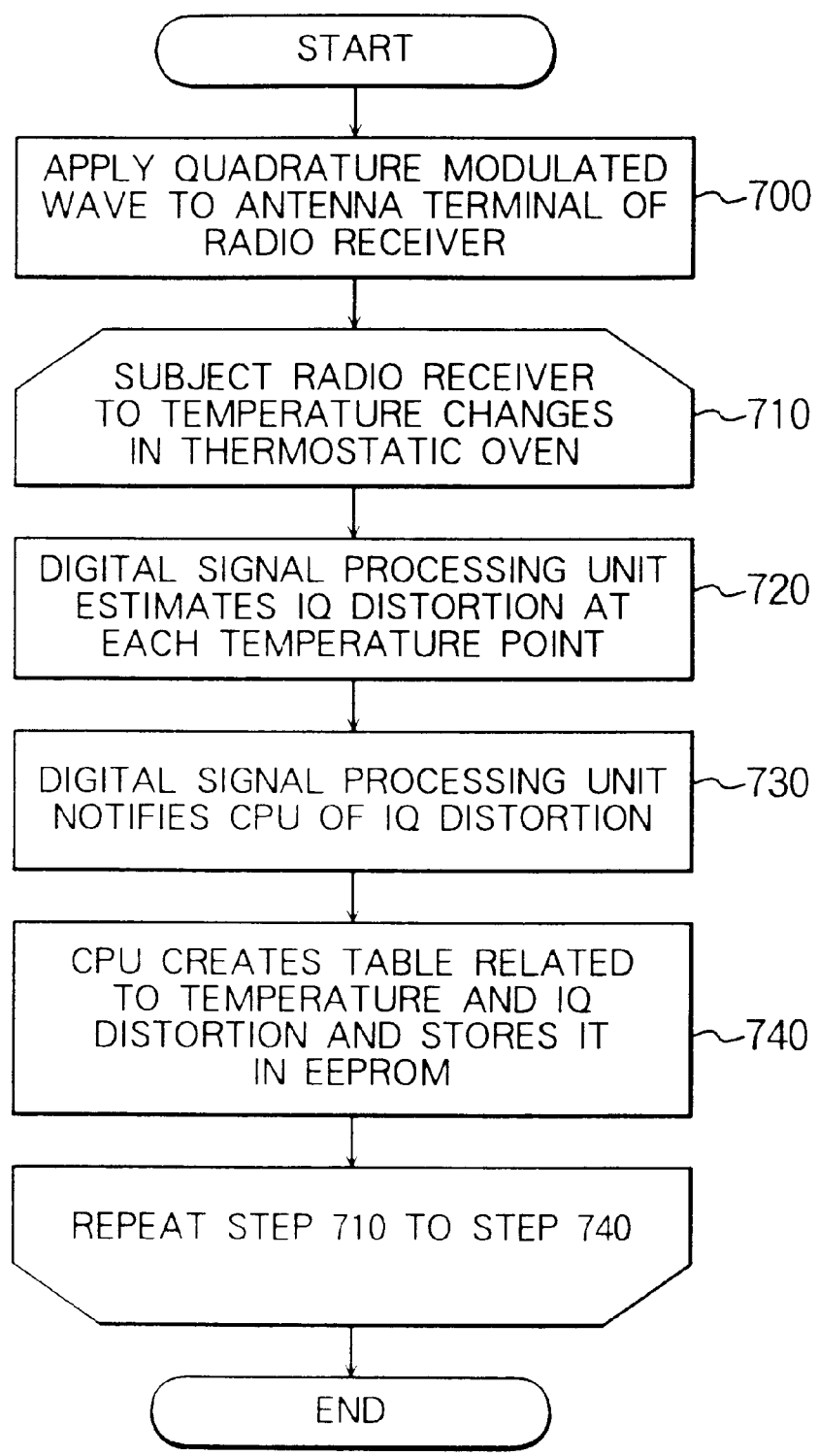
FIG. 18 is a flowchart illustrative of the operation of a digital radio receiver according to the seventh embodiment which is performed prior to actual use.
Figure 19:
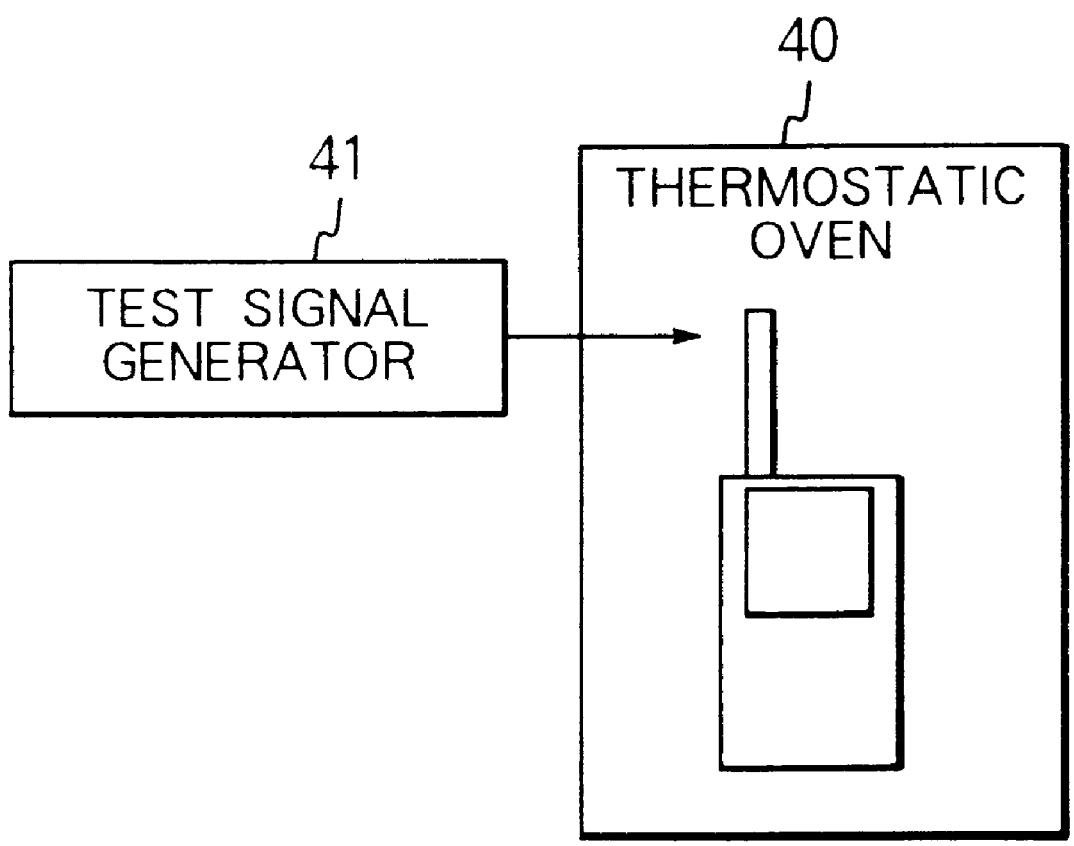
FIG. 19 is a diagram illustrative of the temperature test conducted prior to the actual use of the digital radio receiver according to the seventh embodiment.
Figures 20, 21:
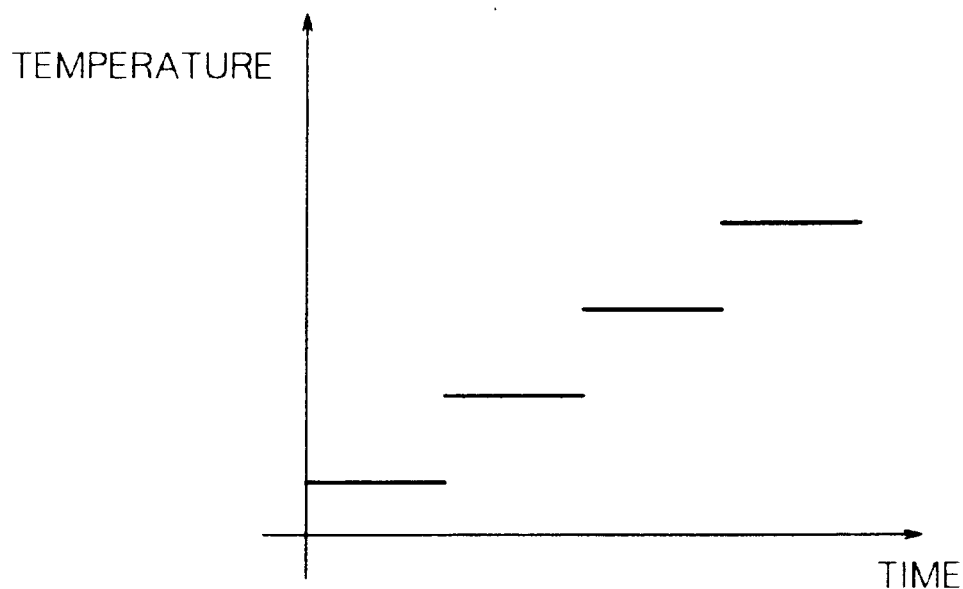
FIG. 20 is a chart showing the relationship between time and temperature of a thermostatic oven according to the seventh embodiment.
FIG. 21 shows a table related to the temperature and IQ distortion according to the seventh embodiment.
Figure 22:
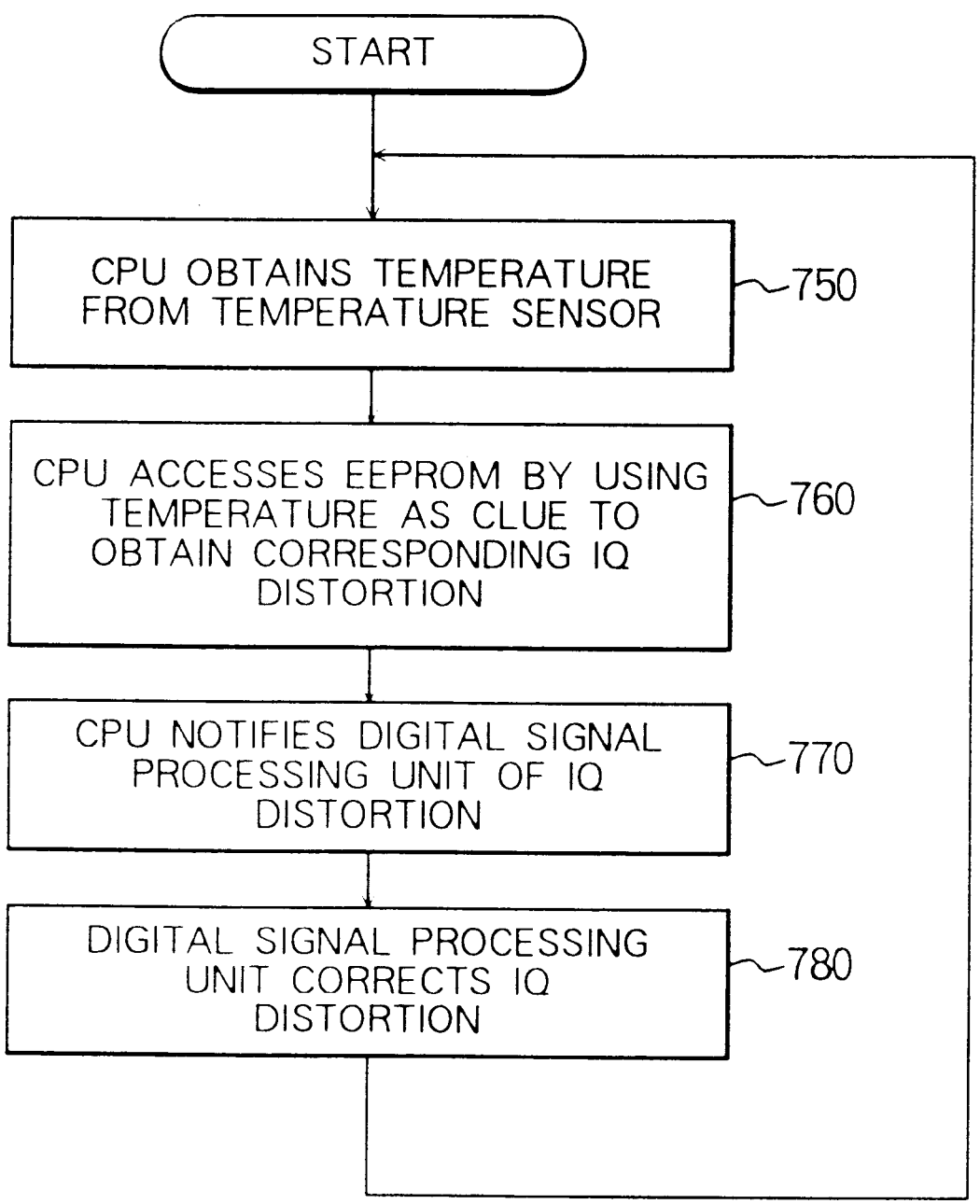
FIG. 22 is a flowchart showing the actual operation of a digital radio receiver according to the seventh embodiment.

The operation of the seventh embodiment will now be described with reference to FIG. 18 through FIG. 22. FIG. 18 is the flowchart showing the operation of the digital radio receiver related to the seventh embodiment before it is put in actual use. FIG. 19 illustrates the temperature test conducted prior to the actual use of the digital radio receiver in accordance with the seventh embodiment. FIG. 20 is a chart indicative of the time and temperature of a thermostatic oven according to the seventh embodiment. FIG. 21 is the table related to the temperature and the IQ distortion according to the seventh embodiment. FIG. 22 is the flowchart showing the operation of the digital radio receiver according to the seventh embodiment in actual use.

A description will be given to a method which employs, for example, the algorithm of the first embodiment to estimate and correct IQ distortion, making it possible to remove the IQ distortion without depending on temperature changes in actual use.

First, the description will be given to the state prior to actual use or prior to shipment in case of a product. The digital radio receiver of the seventh embodiment is placed in a thermostatic oven 40 as shown in FIG. 19.

In a step 700, the digital signal processing unit 8B continues to receive a quadrature modulated wave test signal, which is issued from a test signal generator 41, through the antenna 1.

In a step 710, the radio receiver is subjected to temperature changes as shown in FIG. 20 in the thermostatic oven 40. The temperature of the thermostatic oven 40 nearly coincides with the temperature of the radio receiver and it is maintained until the aforesaid estimating algorithm is completed.

In steps 720 and 730, the digital signal processing unit 8B employs the algorithm of the first embodiment to estimate a parameter ($g^-$, $f^-/b^-$) which corresponds to the DC offset, and a parameter $\sqrt{(b^-)}$ which indicates the IQ amplitude imbalance whenever the temperature is changed and it reports the estimated parameters to the CPU 32.

Then in a step 740, the CPU 32 obtains temperatures through the temperature sensor 30 to prepare the table indicative of the temperatures in relation to the IQ distortion as shown in FIG. 21 and it stores the created table in the EEPROM 31. The series of processing from the step 710 to the step 740 is repeated while changing the temperature by, for instance, ten degrees. The temperature may be changed by twenty or five degrees, whatever value is optimal.

The behavior of the digital radio receiver in actual use will now be described with reference to FIG. 22.

In steps 750, 760, and 770, the CPU 32 obtains the temperature detected through the temperature sensor 30 and it accesses the table stored in the EEPROM 31 by using the obtained temperature as the clue. The CPU 32 then notifies the digital signal processing unit 8B of the retrieved corresponding parameters.

In a step 780, the digital signal processing unit 8B receives the retrieval result from the CPU 32 and sets the corresponding parameters in formulas (20) and (21), thereby acquiring a correct IQ signal.

The above description refers to the case where the algorithm of the first embodiment is used; however, the algorithm of any of the second to sixth embodiments may be used.

Eighth Embodiment:

The eighth embodiment according to the present invention includes an algorithm for correcting the DC offset and a temperature sensor. Before putting in actual use, the digital radio receiver is subjected to temperature changes and it receives a quadrature signal free of bias on a phase plane, which provides a test signal, through an antenna terminal thereof. At this time, all obtained I data and Q data are averaged to calculate the DC offset. Further, a table is prepared which is related to the temperatures detected through the temperature sensor and the aforesaid DC offset. In actual operation, a corresponding DC offset value is retrieved from the table, using the temperature detected through the temperature sensor as the clue, and the DC offset is corrected by subtracting the DC offset from the received I and Q data.

Figure 23:
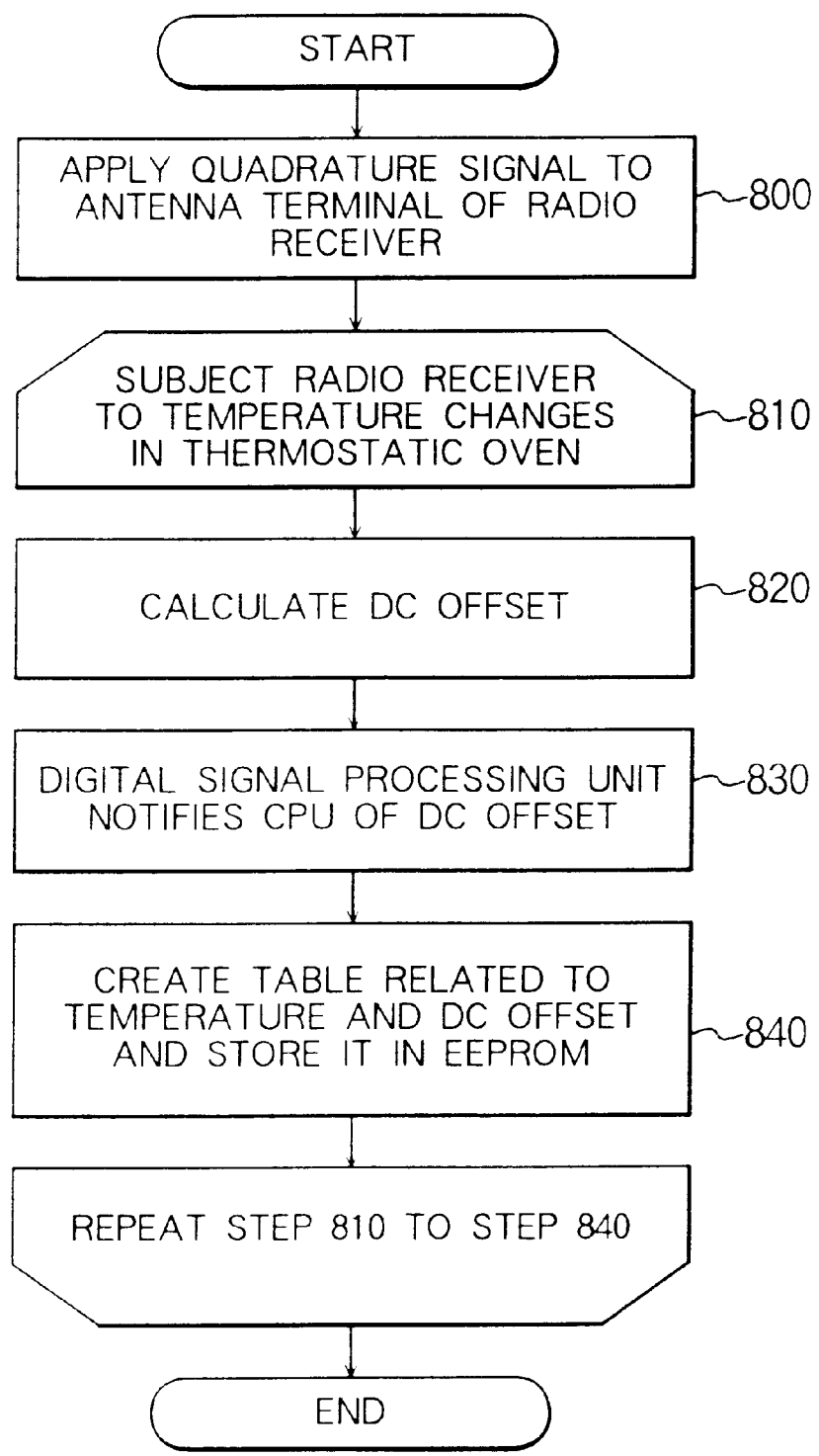
FIG. 23 is a flowchart illustrative of the operation prior to actual use of a digital radio receiver according to an eighth embodiment of the present invention.
Figures 24, 25:
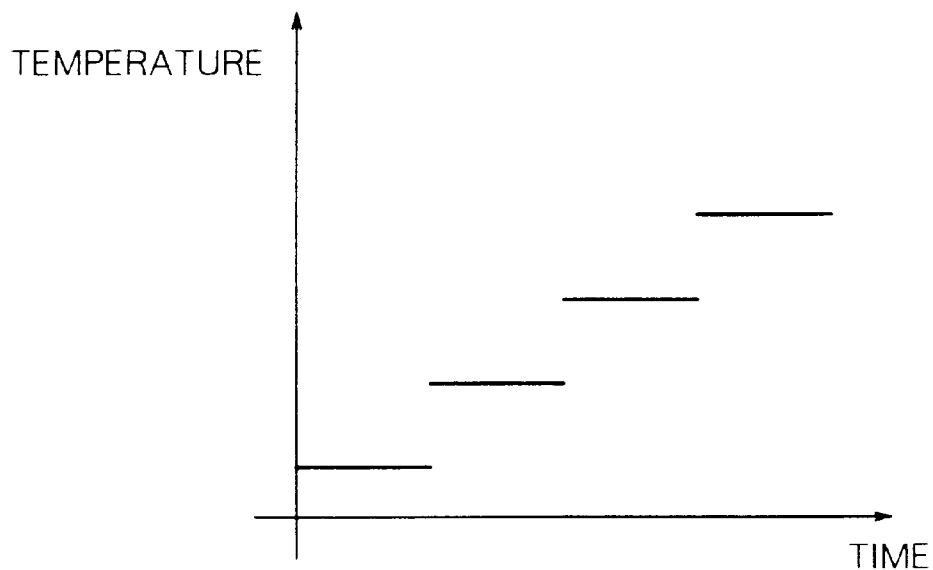
FIG. 24 is a chart showing the relationship between time and temperature of a thermostatic oven according to the eighth embodiment.
FIG. 25 shows a table related to the temperature and DC offset according to the eighth embodiment.
Figure 26:
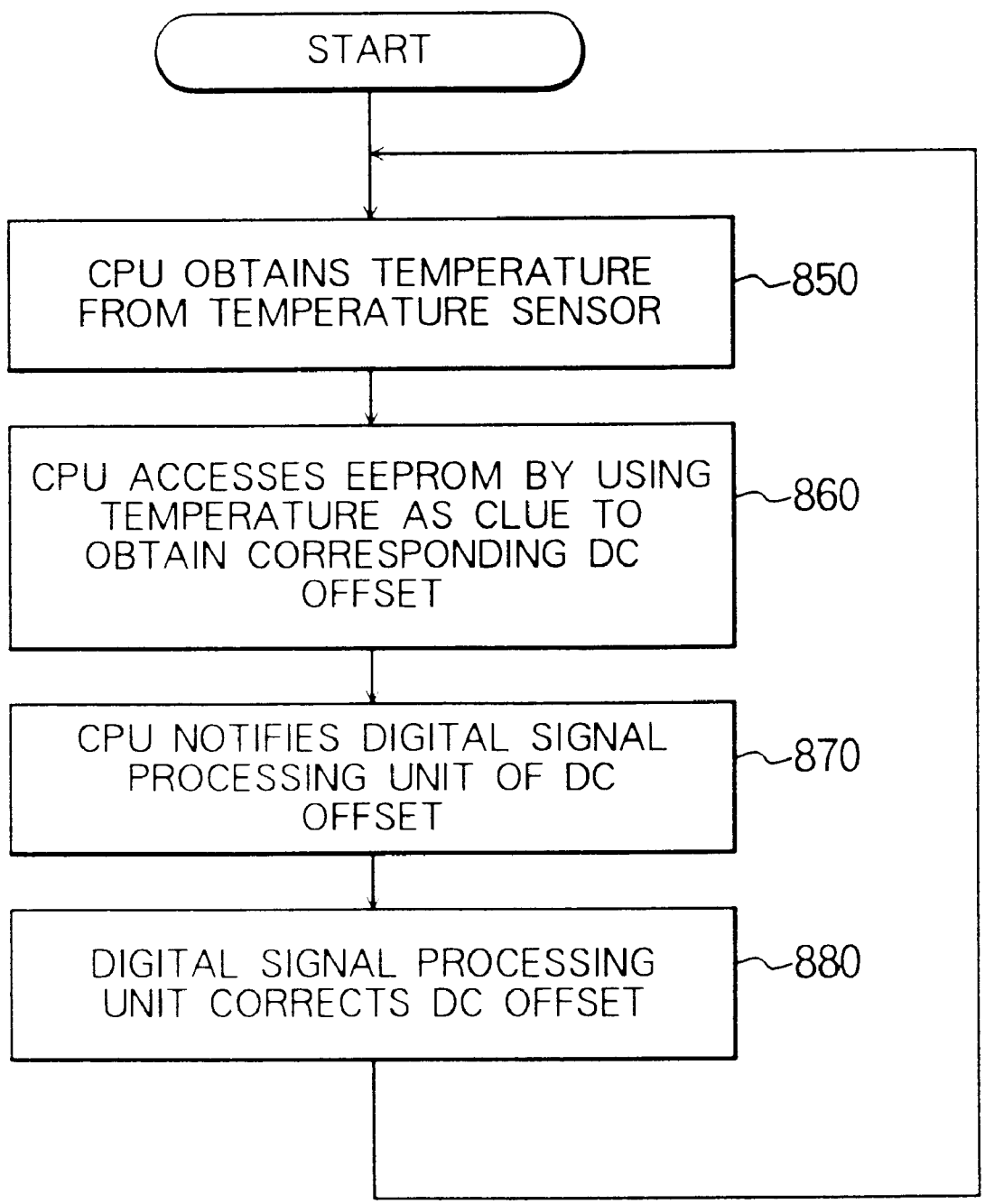
FIG. 26 is a flowchart illustrative of the operation a digital radio receiver according to the eighth embodiment in actual use.
Figure 27:
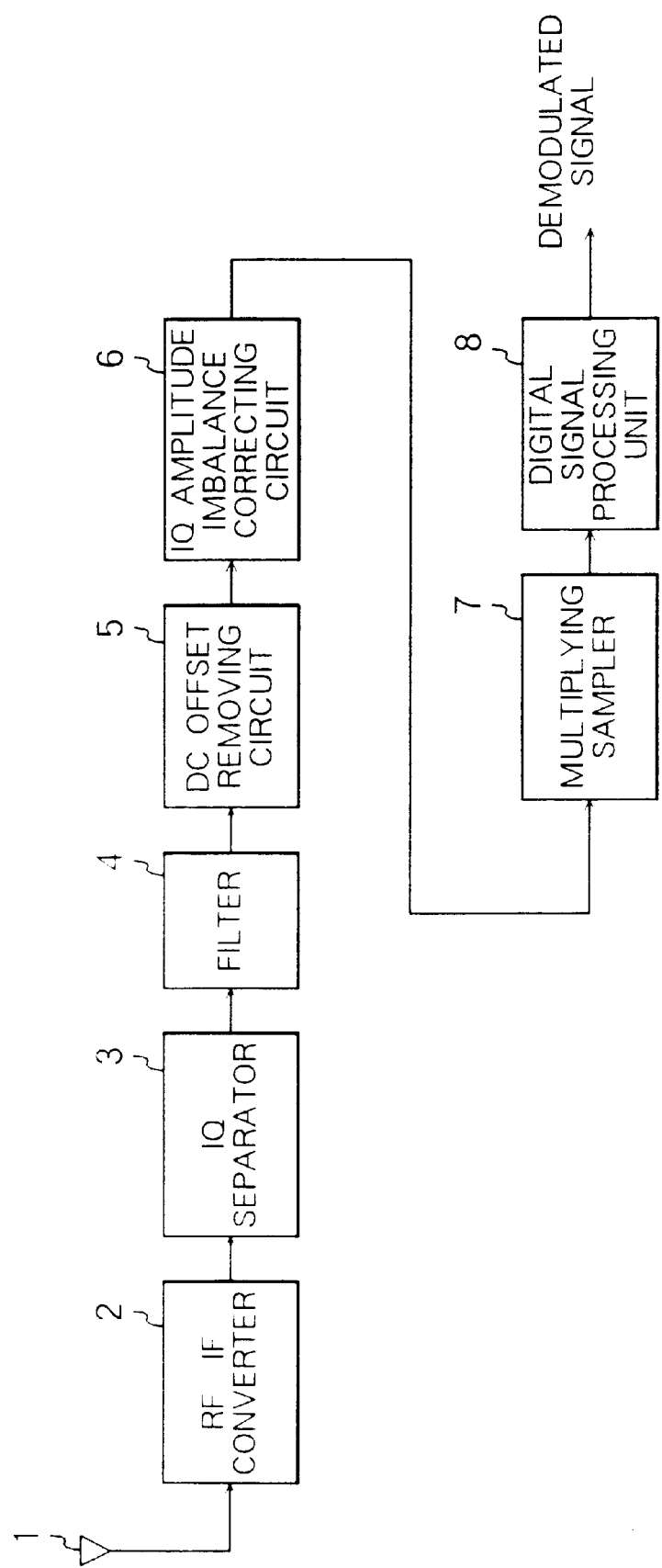
FIG. 27 is a block diagram showing the configuration of a demodulating system of a conventional digital radio receiver.
Figure 28:
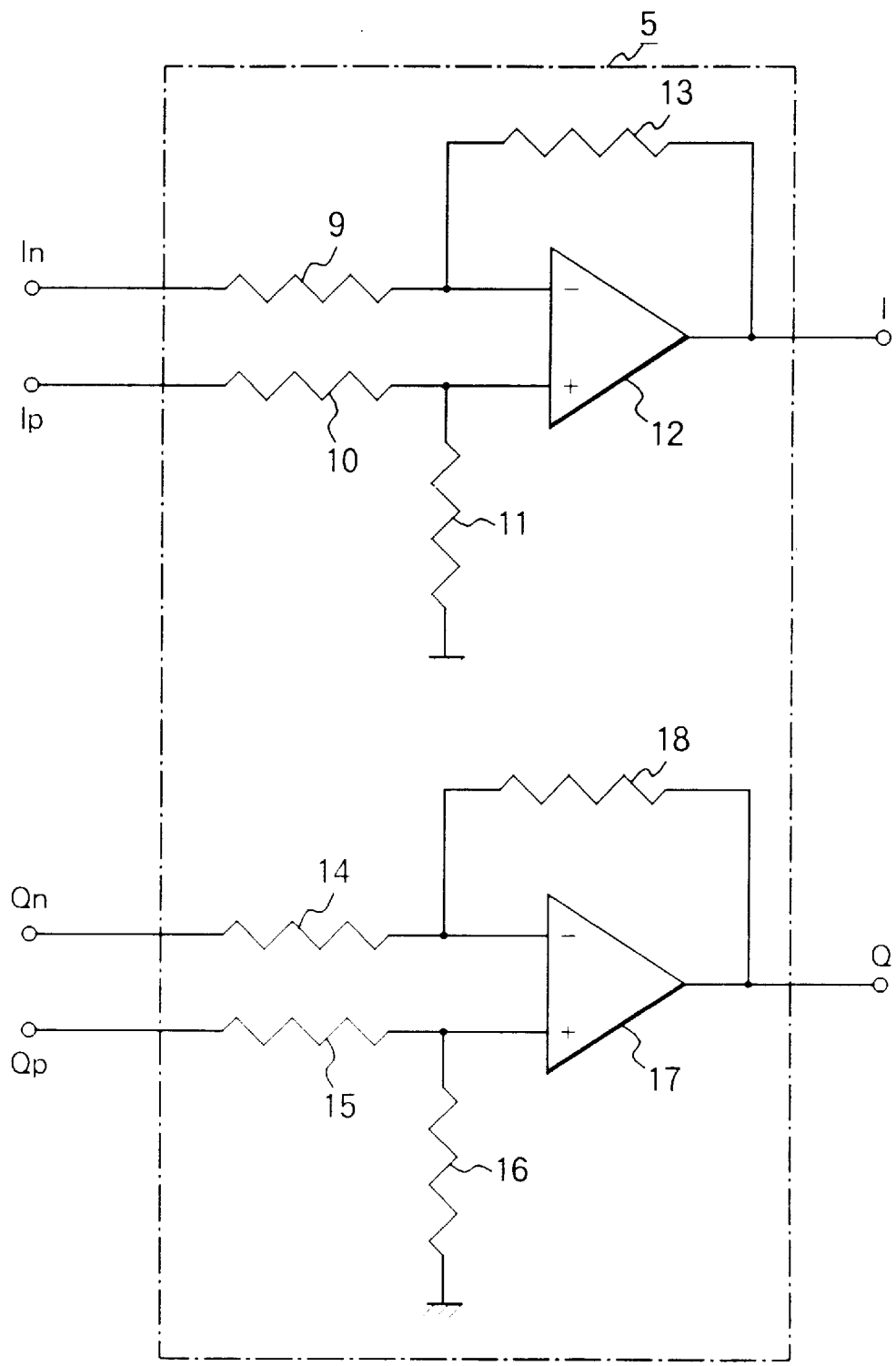
FIG. 28 is a diagram showing the DC offset eliminating circuit shown in FIG. 27.
Figure 29:
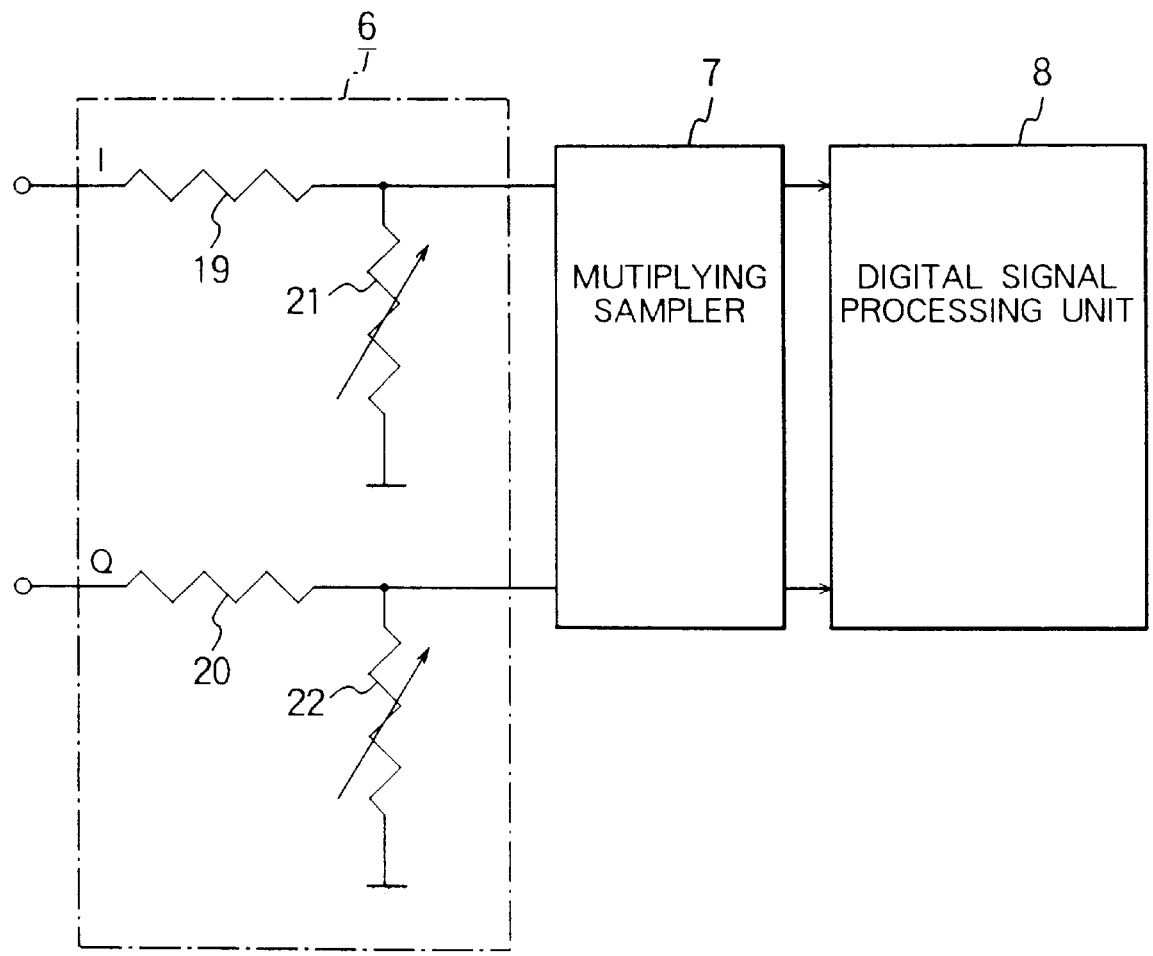
FIG. 29 is a diagram showing the IQ amplitude imbalance correcting circuit shown in FIG. 27.

The eighth embodiment will now be described with reference to FIG. 23 through FIG. 26. FIG. 23 is the flowchart showing the operation of the digital radio receiver related to the eighth embodiment before it is put in actual use. FIG. 24 is a chart indicative of the time and temperature of a thermostatic oven according to the eighth embodiment; and FIG. 25 is the table related to the temperature and the DC offset according to the eighth embodiment. FIG. 26 is the flowchart showing the operation of the digital radio receiver according to the eighth embodiment when it is put in actual use. The system configuration is the same as that of the seventh embodiment shown in FIG. 17.

A description will be given to a method which allows a DC offset to be removed without depending on the temperature changes during actual operation when the I and Q phases are orthogonal, the I and Q amplitudes are balanced, and only the DC offset occurs. In the seventh embodiment, the algorithm of one of the first to sixth embodiments was employed; the eighth embodiment, however, permits even easier estimation and correction of the DC offset.

A quadrature signal free of biased distribution on the phase plane such as the signal given in expressions (95) and (96) is used for the IQ signal which is the output of the test signal generator 41 employed for the temperature test; where ω denotes an appropriate angular frequency, t denotes time, and φ denotes phase angle.

First, the description will be given to the state prior to actual use or prior to shipment in case of a product.

In a step 800, the digital signal processing unit 8B continues to receive the aforesaid quadrature test signal, which is issued from the test signal generator 41, through the antenna 1.

In a step 810, the radio receiver is subjected to temperature changes as shown in FIG. 24 in the thermostatic oven 40. The temperature of the thermostatic oven 40 nearly coincides with the temperature of the radio receiver and it is maintained until the aforesaid estimating algorithm is completed.

In a step 820, the digital signal processing unit 8B calculates the DC offset; more specifically, the arithmetic operation is performed using formulas (97) and (98), where N denotes the number of samples.

In a step 830, the digital signal processing unit 8B estimates $I_{offset}$ and $Q_{offset}$ which correspond to the DC offset whenever the temperature is changed and it reports the estimated parameters to the CPU 32.

Then in a step 840, the CPU 32 reads the temperatures from the temperature sensor 30 to prepare the table indicative of the temperatures in relation to the DC offsets as shown in FIG. 25 and it stores the created table in the EEPROM 31. The series of processing from the step 810 to the step 840 is repeated while changing the temperature by, for instance, ten degrees. The temperature may be changed by twenty or five degrees, whatever value is optimal.

The behavior of the digital radio receiver in actual use will now be described with reference to FIG. 26.

In steps 850, 860 and 870, the CPU 32 obtains the temperature detected through the temperature sensor 30 and it accesses the table stored in the EEPROM 31 by using the obtained temperature as the clue. The CPU 32 then notifies the digital signal processing unit 8B of the retrieved DC offset.

In a step 880, the digital signal processing 8B receives the retrieval result from the CPU 32 and subtracts the corresponding DC offset from the obtained input IQ data, thereby acquiring a correct IQ signal.

$$(I \quad Q \quad 1)\begin{pmatrix} 1 & 0 & g_i \\ 0 & b_i & f_i \\ g_i & f_i & c_i \end{pmatrix}\begin{pmatrix} I \\ Q \\ 1 \end{pmatrix} = 0 \tag{1}$$

$$b_i > 0 \tag{2}$$

$$\det\begin{pmatrix} 1 & 0 & g_i \\ 0 & b_i & f_i \\ g_i & f_i & c_i \end{pmatrix} \neq 0 \tag{3}$$

$$I^2 + b_i Q^2 + 2g_i I + 2f_i Q + c_i = 0 \tag{4}$$

$$I_{1_i}^2 + b_i Q_{1_i}^2 + 2g_i I_{1_i} + 2f_i Q_{1_i} + c_i = 0 \tag{5}$$

$$I_{2_i}^2 + b_i Q_{2_i}^2 + 2g_i I_{2_i} + 2f_i Q_{2_i} + c_i = 0 \tag{6}$$

$$I_{3_i}^2 + b_i Q_{3_i}^2 + 2g_i I_{3_i} + 2f_i Q_{3_i} + c_i = 0 \tag{7}$$

-continued $$I_{4_i}^2 + b_i Q_{4_i}^2 + 2g_i I_{4_i} + 2f_i Q_{4_i} + c_i = 0 \tag{8}$$

$$Z_i = \det\begin{pmatrix} Q_{1_i}^2 & 2I_{1_i} & 2Q_{1_i} & 1 \\ Q_{2_i}^2 & 2I_{2_i} & 2Q_{2_i} & 1 \\ Q_{3_i}^2 & 2I_{3_i} & 2Q_{3_i} & 1 \\ Q_{4_i}^2 & 2I_{4_i} & 2Q_{4_i} & 1 \end{pmatrix} \tag{9}$$

$$b_i = \frac{\det\begin{pmatrix} -I_{1_i}^2 & 2I_{1_i} & 2Q_{1_i} & 1 \\ -I_{2_i}^2 & 2I_{2_i} & 2Q_{2_i} & 1 \\ -I_{3_i}^2 & 2I_{3_i} & 2Q_{3_i} & 1 \\ -I_{4_i}^2 & 2I_{4_i} & 2Q_{4_i} & 1 \end{pmatrix}}{Z_i} \tag{10}$$

$$c_i = \frac{\det\begin{pmatrix} Q_{1_i}^2 & 2I_{1_i} & 2Q_{1_i} & -I_{1_i}^2 \\ Q_{2_i}^2 & 2I_{2_i} & 2Q_{2_i} & -I_{2_i}^2 \\ Q_{3_i}^2 & 2I_{3_i} & 2Q_{3_i} & -I_{3_i}^2 \\ Q_{4_i}^2 & 2I_{4_i} & 2Q_{4_i} & -I_{4_i}^2 \end{pmatrix}}{Z_i} \tag{11}$$

$$f_i = \frac{\det\begin{pmatrix} Q_{1_i}^2 & 2I_{1_i} & -I_{1_i}^2 & 1 \\ Q_{2_i}^2 & 2I_{2_i} & -I_{2_i}^2 & 1 \\ Q_{3_i}^2 & 2I_{3_i} & -I_{3_i}^2 & 1 \\ Q_{4_i}^2 & 2I_{4_i} & -I_{4_i}^2 & 1 \end{pmatrix}}{Z_i} \tag{12}$$

$$g_i = \frac{\det\begin{pmatrix} Q_{1_i}^2 & -I_{1_i}^2 & 2Q_{1_i} & 1 \\ Q_{2_i}^2 & -I_{2_i}^2 & 2Q_{2_i} & 1 \\ Q_{3_i}^2 & -I_{3_i}^2 & 2Q_{3_i} & 1 \\ Q_{4_i}^2 & -I_{4_i}^2 & 2Q_{4_i} & 1 \end{pmatrix}}{Z_i} \tag{13}$$

MINRATIO<$b_i$<MAXRATIO where MINRATIO and MAXRATIO are appropriate positive real numbers. (14)

$$MINR < r_i^2 = \frac{\det\begin{pmatrix} 1 & 0 & g_i \\ 0 & b_i & f_i \\ g_i & f_i & c_i \end{pmatrix}}{b_i} < MAXR \tag{15}$$

where MINR and MAXR are appropriate positive real numbers.

$$g_i^2 + \left(\frac{f_i}{b_i}\right)^2 < MAXCENTER, \tag{16}$$

where MAXCENTER is an appropriate positive real number.

$$\bar{b} = \frac{1}{N} \sum_{i \in VG} b_i \tag{17}$$

-continued $$\bar{f} = \frac{1}{N} \sum_{i \in VG} f_i \quad (18)$$

$$\bar{g} = \frac{1}{N} \sum_{i \in VG} g_i \quad (19)$$

$$\begin{pmatrix} I'_j \\ Q'_j \end{pmatrix} = \begin{pmatrix} I_j \\ Q_j \end{pmatrix} - \begin{pmatrix} -\bar{g} \\ -\bar{f} \\ -\bar{b} \end{pmatrix}, \; j = 0, \cdots, L-1 \quad (20)$$

$$\begin{pmatrix} Inew_j \\ Qnew_j \end{pmatrix} = \begin{pmatrix} I'_j \\ \sqrt{b}\, Q'_j \end{pmatrix}, \; j = 0, \cdots L-1 \quad (21)$$

$$I^2 + Q^2 + 2g_i I + 2f_i Q + c_i = 0 \quad (22)$$

$$\det \begin{pmatrix} 1 & 0 & g_i \\ 0 & 1 & f_i \\ g_i & f_i & c_i \end{pmatrix} \neq 0 \quad (23)$$

$$I_{1_i}^2 + Q_{1_i}^2 + 2g_i I_{1_i} + 2f_i Q_{1_i} + c_i = 0 \quad (24)$$

$$I_{2_i}^2 + Q_{2_i}^2 + 2g_i I_{2_i} + 2f_i Q_{2_i} + c_i = 0 \quad (25)$$

$$I_{3_i}^2 + Q_{3_i}^2 + 2g_i I_{3_i} + 2f_i Q_{3_i} + c_i = 0 \quad (26)$$

$$Z_i = \det \begin{pmatrix} 2I_{1_i} & 2Q_{1_i} & 1 \\ 2I_{2_i} & 2Q_{2_i} & 1 \\ 2I_{3_i} & 2Q_{3_i} & 1 \end{pmatrix} \quad (27)$$

$$c_i = \frac{\det \begin{pmatrix} 2I_{1_i} & 2Q_{1_i} & -I_{1_i}^2 - Q_{1_i}^2 \\ 2I_{2_i} & 2Q_{2_i} & -I_{2_i}^2 - Q_{2_i}^2 \\ 2I_{3_i} & 2Q_{3_i} & -I_{3_i}^2 - Q_{3_i}^2 \end{pmatrix}}{Z_i} \quad (28)$$

$$f_i = \frac{\det \begin{pmatrix} 2I_{1_i} & -I_{1_i}^2 - Q_{1_i}^2 & 1 \\ 2I_{2_i} & -I_{2_i}^2 - Q_{2_i}^2 & 1 \\ 2I_{3_i} & -I_{3_i}^2 - Q_{3_i}^2 & 1 \end{pmatrix}}{Z_i} \quad (29)$$

$$g_i = \frac{\det \begin{pmatrix} -I_{1_i}^2 - Q_{1_i}^2 & 2Q_{1_i} & 1 \\ -I_{2_i}^2 - Q_{2_i}^2 & 2Q_{2_i} & 1 \\ -I_{3_i}^2 - Q_{3_i}^2 & 2Q_{3_i} & 1 \end{pmatrix}}{Z_i} \quad (30)$$

$$\bar{f} = \frac{1}{N} \sum_{i \in VG} f_i \quad (33)$$

$$\bar{g} = \frac{1}{N} \sum_{i \in VG} g_i \quad (34)$$

$$\begin{pmatrix} Inew_j \\ Qnew_j \end{pmatrix} = \begin{pmatrix} I_j \\ Q_j \end{pmatrix} - \begin{pmatrix} -\bar{g} \\ -\bar{f} \end{pmatrix}, \; j = 0, \cdots, L-1 \quad (35)$$

$$I^2 + b_i Q^2 + c_i = 0 \quad (36)$$

$$b_i c_i \neq 0 \quad (37)$$

$$I_{1_i}^2 + b_i Q_{1_1}^2 + c_i = 0 \quad (38)$$

$$I_{2_i}^2 + b_i Q_{2_1}^2 + c_i = 0 \quad (39)$$

$$Z_i = \det \begin{pmatrix} Q_{1_i}^2 & 1 \\ Q_{2_i}^2 & 1 \end{pmatrix} \quad (40)$$

$$b_i = \frac{\det \begin{pmatrix} -I_{1_i}^2 & 1 \\ -I_{2_i}^2 & 1 \end{pmatrix}}{Z_i} \quad (41)$$

$$c_i = \frac{\det \begin{pmatrix} Q_{1_i}^2 & -I_{1_i}^2 \\ Q_{2_i}^2 & -I_{2_i}^2 \end{pmatrix}}{Z_i} \quad (42)$$

$$\text{MINRATIO} < b_i < \text{MAXRATIO} \quad (43)$$

where MINRATIO and MAXPATIO are appropriate positive real numbers.

$$\text{MINR} < -c_i < \text{MAXR} \quad (44)$$

where MINR and MAXR are appropriate positive real numbers.

$$\bar{b} = \frac{1}{N} \sum_{i \in VG} b_i \quad (45)$$

$$\begin{pmatrix} Inew_j \\ Qnew_j \end{pmatrix} = \begin{pmatrix} I_j \\ \sqrt{b}\, Q_j \end{pmatrix} \quad (46)$$

$$\begin{pmatrix} Idiff_j \\ Qdiff_j \end{pmatrix} = \begin{pmatrix} I_{j+1} \\ Q_{j+1} \end{pmatrix} - \begin{pmatrix} I_j \\ Q_j \end{pmatrix}, \; j = 0, \cdots L-2 \quad (47)$$

$$norm = \sqrt{\sum_{j=0}^{L-2} (Idiff_j^2 + Qdiff_j^2)} \quad (48)$$

$$\begin{pmatrix} Inew_0 \\ Qnew_0 \end{pmatrix} = \frac{round \times norm}{\sqrt{2}} \begin{pmatrix} 1 \\ 1 \end{pmatrix} \quad (49)$$

$$\begin{pmatrix} Inew_{j+1} \\ Qnew_{j+1} \end{pmatrix} = \begin{pmatrix} Idiff_j \\ Qdiff_j \end{pmatrix} + \begin{pmatrix} Inew_j \\ Qnew_j \end{pmatrix}, \; j = 0, \cdots, L-2 \quad (50)$$

$$(I, Q, 1) \begin{pmatrix} 1 & h_i & g_i \\ h_i & b_i & f_i \\ g_i & f_i & c_i \end{pmatrix} \begin{pmatrix} I \\ Q \\ 1 \end{pmatrix} = 0 \quad (51)$$

$$b_i - h_i^2 > 0 \quad (52)$$

$$\det \begin{pmatrix} 1 & h_i & g_i \\ h_i & b_i & f_i \\ g_i & f_i & c_i \end{pmatrix} \neq 0 \quad (53)$$

$$I^2 + 2h_i IQ + b_i Q^2 + 2g_i I + 2f_i Q + c_i = 0 \quad (54)$$

$$I_{1_i}^2 + 2h_i I_{1_i} Q_{1_i} + b_i Q_{1_i}^2 + 2g_i I_{1_i} + 2f_i Q_{1_i} + c_i = 0 \quad (55)$$

$$I_{2_i}^2 + 2h_i I_{2_i} Q_{2_i} + b_i Q_{2_i}^2 + 2g_i I_{2_i} + 2f_i Q_{2_i} + c_i = 0 \quad (56)$$

$$I_{3_i}^2 + 2h_i I_{3_i} Q_{3_i} + b_i Q_{3_i}^2 + 2g_i I_{3_i} + 2f_i Q_{3_i} + c_i = 0 \quad (57)$$

$$I_{4_i}^2 + 2h_i I_{4_i} Q_{4_i} + b_i Q_{4_i}^2 + 2g_i I_{4_i} + 2f_i Q_{4_i} + c_i = 0 \quad (58)$$

$$I_{5_i}^2 + 2h_i I_{5_i} Q_{5_i} + b_i Q_{5_i}^2 + 2g_i I_{5_i} + 2f_i Q_{5_i} + c_i = 0 \quad (59)$$

$$Z_i = \det \begin{pmatrix} 2I_{1_i}Q_{1_i} & Q_{1_i}^2 & 2I_{1_i} & 2Q_{1_i} & 1 \\ 2I_{2_i}Q_{2_i} & Q_{2_i}^2 & 2I_{2_i} & 2Q_{2_i} & 1 \\ 2I_{3_i}Q_{3_i} & Q_{3_i}^2 & 2I_{3_i} & 2Q_{3_i} & 1 \\ 2I_{4_i}Q_{4_i} & Q_{4_i}^2 & 2I_{4_i} & 2Q_{4_i} & 1 \\ 2I_{5_i}Q_{5_i} & Q_{5_i}^2 & 2I_{5_i} & 2Q_{5_i} & 1 \end{pmatrix} \quad (60)$$

$$b_i = \frac{\det \begin{pmatrix} 2I_{1_i}Q_{1_i} & -I_{1_i}^2 & 2I_{1_i} & 2Q_{1_i} & 1 \\ 2I_{2_i}Q_{2_i} & -I_{2_i}^2 & 2I_{2_i} & 2Q_{2_i} & 1 \\ 2I_{3_i}Q_{3_i} & -I_{3_i}^2 & 2I_{3_i} & 2Q_{3_i} & 1 \\ 2I_{4_i}Q_{4_i} & -I_{4_i}^2 & 2I_{4_i} & 2Q_{4_i} & 1 \\ 2I_{5_i}Q_{5_i} & -I_{5_i}^2 & 2I_{5_i} & 2Q_{5_i} & 1 \end{pmatrix}}{Z_i} \quad (61)$$

$$c_i = \frac{\det \begin{pmatrix} 2I_{1_i}Q_{1_i} & Q_{1_i}^2 & 2I_{1_i} & 2Q_{1_i} & -I_{1_i}^2 \\ 2I_{2_i}Q_{2_i} & Q_{2_i}^2 & 2I_{2_i} & 2Q_{2_i} & -I_{2_i}^2 \\ 2I_{3_i}Q_{3_i} & Q_{3_i}^2 & 2I_{3_i} & 2Q_{3_i} & -I_{3_i}^2 \\ 2I_{4_i}Q_{4_i} & Q_{4_i}^2 & 2I_{4_i} & 2Q_{4_i} & -I_{4_i}^2 \\ 2I_{5_i}Q_{5_i} & Q_{5_i}^2 & 2I_{5_i} & 2Q_{5_i} & -I_{5_i}^2 \end{pmatrix}}{Z_i} \quad (62)$$

$$f_i = \frac{\det \begin{pmatrix} 2I_{1_i}Q_{1_i} & Q_{1_i}^2 & 2I_{1_i} & -I_{1_i}^2 & 1 \\ 2I_{2_i}Q_{2_i} & Q_{2_i}^2 & 2I_{2_i} & -I_{2_i}^2 & 1 \\ 2I_{3_i}Q_{3_i} & Q_{3_i}^2 & 2I_{3_i} & -I_{3_i}^2 & 1 \\ 2I_{4_i}Q_{4_i} & Q_{4_i}^2 & 2I_{4_i} & -I_{4_i}^2 & 1 \\ 2I_{5_i}Q_{5_i} & Q_{5_i}^2 & 2I_{5_i} & -I_{5_i}^2 & 1 \end{pmatrix}}{Z_i} \quad (63)$$

$$g_i = \frac{\det \begin{pmatrix} 2I_{1_i}Q_{1_i} & Q_{1_i}^2 & -I_{1_i}^2 & 2Q_{1_i} & 1 \\ 2I_{2_i}Q_{2_i} & Q_{2_i}^2 & -I_{2_i}^2 & 2Q_{2_i} & 1 \\ 2I_{3_i}Q_{3_i} & Q_{3_i}^2 & -I_{3_i}^2 & 2Q_{3_i} & 1 \\ 2I_{4_i}Q_{4_i} & Q_{4_i}^2 & -I_{4_i}^2 & 2Q_{4_i} & 1 \\ 2I_{5_i}Q_{5_i} & Q_{5_i}^2 & -I_{5_i}^2 & 2Q_{5_i} & 1 \end{pmatrix}}{Z_i} \quad (64)$$

$$h_i = \frac{\det \begin{pmatrix} -I_{1_i}^2 & Q_{1_i}^2 & 2I_{1_i} & 2Q_{1_i} & 1 \\ -I_{2_i}^2 & Q_{2_i}^2 & 2I_{2_i} & 2Q_{2_i} & 1 \\ -I_{3_i}^2 & Q_{3_i}^2 & 2I_{3_i} & 2Q_{3_i} & 1 \\ -I_{4_i}^2 & Q_{4_i}^2 & 2I_{4_i} & 2Q_{4_i} & 1 \\ -I_{5_i}^2 & Q_{5_i}^2 & 2I_{5_i} & 2Q_{5_i} & 1 \end{pmatrix}}{Z_i} \quad (65)$$

$$\text{MINRATIO} < b_i < \text{MAXRATIO} \quad (66)$$

where MAXRATIO and MINRATIO are appropriate positive real numbers.

$$\text{MINR} < r_i^2 = -\frac{\det \begin{pmatrix} 1 & h_i & g_i \\ h_i & b_i & f_i \\ g_i & f_i & c_i \end{pmatrix}}{b_i - h_i^2} < \text{MAXR} \quad (67)$$

where MINR and MAXR are appropriate positive real numbers.

$$\frac{(b_i g_i - f_i h_i)^2 + (f_i - g_i h_i)^2}{(h_i^2 - b_i)^2} < \text{MAXCENTER} \quad (68)$$

$$\bar{b} = \frac{1}{N} \sum_{i \in VG} b_i \quad (69)$$

$$\bar{c} = \frac{1}{N} \sum_{i \in VG} c_i \quad (70)$$

$$\bar{f} = \frac{1}{N} \sum_{i \in VG} f_i \quad (71)$$

$$\bar{g} = \frac{1}{N} \sum_{i \in VG} g_i \quad (72)$$

$$\bar{h} = \frac{1}{N} \sum_{i \in VG} h_i \quad (73)$$

$$\begin{pmatrix} I'_j \\ Q'_j \end{pmatrix} = \begin{pmatrix} I_j \\ Q_j \end{pmatrix} - \frac{1}{h_i^2 - b_i} \begin{pmatrix} b_i g_i - f_i h_i \\ f_i - g_i h_i \end{pmatrix}, \quad j = 0, \cdots, L-1 \quad (74)$$

$$\begin{pmatrix} I'_j \\ Q'_j \end{pmatrix} = \sqrt{\bar{c}} \cos\theta_j \begin{pmatrix} 1 \\ 0 \end{pmatrix} + \sqrt{\frac{\bar{c}}{\bar{b}(\bar{h}^2+1)}} \sin\theta_j \begin{pmatrix} -\bar{h} \\ 1 \end{pmatrix} \quad (75)$$

$$\begin{pmatrix} Inew'_j \\ Qnew'_j \end{pmatrix} = \begin{pmatrix} \cos\theta_j \\ \sin\theta_j \end{pmatrix} = \begin{pmatrix} \dfrac{I'_j + \bar{h} Q'_j}{\sqrt{\bar{c}}} \\ Q'_j \sqrt{\dfrac{\bar{b}(\bar{h}^2+1)}{\bar{c}}} \end{pmatrix} \quad (76)$$

$$(I, Q, 1) \begin{pmatrix} 1 & h_i & 0 \\ h_i & b_i & 0 \\ 0 & 0 & c_i \end{pmatrix} \begin{pmatrix} I \\ Q \\ 1 \end{pmatrix} = 0 \quad (77)$$

$$b_i - h_i^2 > 0 \quad (78)$$

$$c_i \neq 0 \quad (79)$$

$$I^2 + 2h_i IQ + b_i Q^2 + c_i = 0 \quad (80)$$

$$I_{1_i}^2 + 2h_i I_{1_i} Q_{1_i} + b_i Q_{1_i}^2 + c_i = 0 \quad (81)$$

$$I_{2_i}^2 + 2h_i I_{2_i} Q_{2_i} + b_i Q_{2_i}^2 + c_i = 0 \quad (82)$$

$$I_{3_i}^2 + 2h_i I_{3_i} Q_{3_i} + b_i Q_{3_i}^2 + c_i = 0 \quad (83)$$

$$Z_i = \det \begin{pmatrix} 2I_{1_i}Q_{1_i} & Q_{1_i}^2 & 1 \\ 2I_{2_i}Q_{2_i} & Q_{2_i}^2 & 1 \\ 2I_{3_i}Q_{3_i} & Q_{3_i}^2 & 1 \end{pmatrix} \quad (84)$$

$$b_i = \frac{\det \begin{pmatrix} 2I_{1_i}Q_{1_i} & -I_{1_i}^2 & 1 \\ 2I_{2_i}Q_{2_i} & -I_{2_i}^2 & 1 \\ 2I_{3_i}Q_{3_i} & -I_{3_i}^2 & 1 \end{pmatrix}}{Z_i} \quad (85)$$

$$c_i = \frac{\det \begin{pmatrix} 2I_{1_i}Q_{1_i} & Q_{1_i}^2 & -I_{1_i}^2 \\ 2I_{2_i}Q_{2_i} & Q_{2_i}^2 & -I_{2_i}^2 \\ 2I_{3_i}Q_{3_i} & Q_{3_i}^2 & -I_{3_i}^2 \end{pmatrix}}{Z_i} \quad (86)$$

-continued $$h_i = \frac{\det\begin{pmatrix} -I_{1_i}^2 & Q_{1_i}^2 & 1 \\ -I_{2_i}^2 & Q_{2_i}^2 & 1 \\ -I_{3_i}^2 & Q_{3_i}^2 & 1 \end{pmatrix}}{Z_i} \quad (87)$$

$$\text{MINRATIO} < b_i < \text{MAXRATIO} \quad (88)$$

where MAXRATIO and MINRATIO are appropriate positive real numbers.

$$\text{MINR} < c_i < \text{MAXR} \quad (89)$$

where MINR and MAXR are appropriate positive real numbers.

$$\overline{b} = \frac{1}{N}\sum_{i \in VG} b_i \quad (90)$$

$$\overline{c} = \frac{1}{N}\sum_{i \in VG} c_i \quad (91)$$

$$\overline{h} = \frac{1}{N}\sum_{i \in VG} h_i \quad (92)$$

$$\begin{pmatrix} I_j \\ Q_j \end{pmatrix} = \sqrt{\overline{c}}\cos\theta_j \begin{pmatrix} 1 \\ 0 \end{pmatrix} + \sqrt{\frac{\overline{c}}{\overline{b}(\overline{h}^2+1)}}\sin\theta_j \begin{pmatrix} -\overline{h} \\ 1 \end{pmatrix} \quad (93)$$

$$\begin{pmatrix} Inew_j \\ Qnew_j \end{pmatrix} = \begin{pmatrix} \cos\theta_j \\ \sin\theta_j \end{pmatrix} = \begin{pmatrix} \dfrac{I_j + \overline{h}Q'_j}{\sqrt{\overline{c}}} \\ Q_j\sqrt{\dfrac{\overline{b}(\overline{h}^2+1)}{\overline{c}}} \end{pmatrix} \quad (94)$$

$$I(t) = \cos(\omega t + \phi) \quad (95)$$

$$Q(t) = \sin(\omega t + \phi) \quad (96)$$

$$Ioffset = \sum_{t=0}^{N-1} I(t)/N \quad (97)$$

$$Qoffset = \sum_{t=0}^{N-1} Q(t)/N \quad (98)$$

What is claimed is:

1. A digital radio receiver comprising:

receiving means for receiving an input signal; and demodulating means for estimating the distortion of said input signal, eliminating said estimated distortion from said input signal to obtain a proper input signal, performing demodulation based on said proper input signal, and issuing a demodulated signal;

wherein said receiving means includes an antenna for receiving a radio frequency, an RF/IF converter for converting said radio frequency to an intermediate frequency, an IO separator for separating I and O of said intermediate frequency, a filter for removing a noise from the output of said IO separator, and a multiplying sampler for sampling an output of said filter;

wherein said demodulating means is a digital signal processing unit for performing quadrature phase demodulation based on said proper input signal;

wherein I and Q phases are orthogonal, and said digital signal processing unit divides data on said sampled quadrature phase demodulated wave into groups on a basis of a plurality of IQ coordinates, estimates a parameter of an elliptical equation passing said plurality of IQ coordinates for each group, verifies said parameter for physical validity to select a group which has valid parameters, averages the parameters of said selected group, and removes distortion from the data on said quadrature phase demodulated wave according to the obtained mean value.

2. The digital radio receiver according to claim 1, wherein, if DC offset and IQ amplitude imbalance are present, then said digital signal processing unit divides said sampled data into groups for every four IQ coordinates, estimates a parameter related to the amplitude and central coordinate of an elliptical equation passing said four IQ coordinates for each group, verifies said parameter for physical validity to select a group which has valid parameters, averages the parameters of said selected group, uses the obtained mean value for an IQ amplitude ratio and a DC offset amount, subtracts said DC offset amount from said sampled data, and multiplies said subtracted value by said IQ amplitude ratio.

3. The digital radio receiver according to claim 1, wherein, if DC offset is present, then said digital signal processing unit divides said sampled data into groups for every three IQ coordinates, estimates a parameter related to the central coordinate of a circular equation passing said three IQ coordinates for each group, verifies said parameter for physical validity to select a group which has valid parameters, averages the parameters of said selected group, uses the obtained mean value as a DC offset amount, and subtracts said DC offset amount from said sampled data.

4. The digital radio receiver according to claim 1, wherein, if IQ amplitude imbalance is present, then said digital signal processing unit divides said sampled data into groups for every two IQ coordinates, estimates a parameter related to the amplitude of an elliptical equation passing said two IQ coordinates for each group, verifies said parameter for physical validity to select a group which has valid parameters, averages the parameters of said selected group, uses the obtained mean value as an IQ amplitude ratio, and multiplies said sampled data by said IQ amplitude ratio.

5. A digital radio receiver comprising:

receiving means for receiving an input signal; and demodulating means for estimating the distortion of said input signal, eliminating said estimated distortion from said input signal to obtain a proper input signal, performing demodulation based on said proper input signal, and issuing a demodulated signal;

wherein said receiving means includes an antenna for receiving a radio frequency, an RF/IF converter for converting said radio frequency to an intermediate frequency, an IO separator for separating I and O of said intermediate frequency, a filter for removing a noise from the output of said IO separator, and a multiplying sampler for sampling an output of said filter;

wherein said demodulating means is a digital signal processing unit for performing quadrature phase demodulation based on said proper input signal;

wherein, the I and Q phases are orthogonal and only DC offset is present, then said digital signal processing unit calculates a difference among respective pieces of data (I, Q) on sampled π/4 shift QPSK demodulated wave, establishes one of (I, Q)={K(1, 1), K(1, −1)} (K is an appropriate real number value) as the starting point, and vector-adds in succession said difference with respect to the vector of the starting point.

6. A digital radio receiver comprising:

receiving means for receiving an input signal; and demodulating means for estimating the distortion of said input signal, eliminating said estimated distortion from said input signal to obtain a proper input signal, performing demodulation based on said proper input signal, and issuing a demodulated signal;

wherein said receiving means includes an antenna for receiving a radio frequency, an RF/IF converter for converting said radio frequency to an intermediate frequency, an IO separator for separating I and O of said intermediate frequency, a filter for removing a noise from the output of said IO separator, and a multiplying sampler for sampling an output of said filter;

wherein said demodulating means is a digital signal processing unit for performing quadrature phase demodulation based on said proper input signal;

wherein, the I and Q phases are not orthogonal, then said digital signal processing unit divides said data on sampled quadrature phase demodulated wave into groups on a basis of a plurality of IQ coordinates, estimates a parameter of an elliptical equation passing said plurality of IQ coordinates for each group, verifies said parameter for physical validity to select a group which has valid parameters, averages the parameters of said selected group, estimates a correct phase angle according to the obtained mean value, and relocates data which corresponds to the phase angle on the circumference of radius 1.

7. The digital radio receiver according to claim 6, wherein, if DC offset and IQ amplitude imbalance are present, then said digital signal processing unit divides said sampled data into groups for every five IQ coordinates, estimates a parameter of an elliptical equation passing said five IQ coordinates for each group, verifies said parameter for physical validity to select a group which has valid parameters, averages the parameters of said selected group, estimates a DC offset amount according to the obtained mean value, subtracts said DC offset amount from said sampled data, further estimates a correct phase angle from the mean value of said valid parameters, and relocates data which corresponds to the phase angle on the circumference of radius 1.

8. The digital radio receiver according to claim 6, wherein, if IQ amplitude imbalance is present, then said digital signal processing unit divides said sampled data into groups for every three IQ coordinates, estimates a parameter of an elliptical equation passing said three IQ coordinates for each group, verifies said parameter for physical validity to select a group which has valid parameters, averages the parameters of said selected group, estimates a correct phase angle from the obtained mean value, and relocates data which corresponds to the phase angle on the circumference of radius 1.

9. A digital radio receiver comprising: retaining means for retaining distortion data, which is caused by temperature changes and which has been estimated by a test signal beforehand;

wherein said retaining means is a memory for storing distortion data for each temperature change;

receiving means for receiving an input signal; and demodulation means for acquiring a proper input signal by eliminating said retained distortion from said input signal, performing demodulation in accordance with said proper input signal, and issuing a demodulated signal, and wherein said receiving means includes an antenna for receiving a radio frequency, an RF/IF converter for converting said radio frequency to an intermediate frequency, an IO separator for separating I and O of said intermediate frequency, a filter for removing a noise from an output of said IO separator, and a multiplying sampler for sampling an output of said filter, and wherein said demodulating means is a digital signal processing unit which performs quadrature phase demodulation based on said proper input signal, and further comprising:

a CPU; and a temperature sensor for detecting temperature;

wherein, prior to actual use, said digital signal processing unit receives said data on a quadrature modulated wave test signal, which has been sampled for each temperature change, and estimates a distortion of said quadrature modulated wave test signal by a predetermined algorithm, and said CPU creates a table related to a temperature, which can be obtained through said temperature sensor, and data on said estimated distortion in said memory; and in actual use, said CPU retrieves corresponding distortion data from said table, using a temperature detected by said temperature sensor as a clue, and said digital signal processing unit removes the distortion from said input signal in accordance with said retrieved distortion data.

10. A digital radio receiver comprising:

retaining means for retaining distortion data, which is caused by temperature changes and which has been estimated by a test signal beforehand;

wherein said retaining means is a memory for storing distortion data for each temperature change;

receiving means for receiving an input signal; and demodulation means for acquiring a proper input signal by eliminating said retained distortion from said input signal, performing demodulation in accordance with said proper input signal, and issuing a demodulated signal, and wherein said receiving means includes an antenna for receiving a radio frequency, an RF/IF converter for converting said radio frequency to an intermediate frequency, an IO separator for separating I and O of said intermediate frequency, a filter for removing a noise from an output of said IO separator, and a multiplying sampler for sampling an output of said filter, and wherein said demodulating means is a digital signal processing unit which performs quadrature phase demodulation based on said proper input signal.

and further comprising:

a CPU; and a temperature sensor for detecting temperature;

wherein, when it is guaranteed in advance that only DC offset will occur;

prior to actual use, said digital signal processing unit receives said quadrature test signal data which has been sampled evenly on a phase plane for every temperature change, estimates the DC offset by averaging all obtained I data and Q data, and said CPU creates a table, which is related to the temperature, which can be obtained from said temperature sensor, and said estimated DC offset, in a memory; and in actual use, said CPU retrieves a corresponding estimated DC offset from said table by using the temperature, which has been detected by said temperature sensor, as a clue, then said digital signal processing unit subtracts said estimated DC offset from said input signal in accordance with said estimated DC offset which has been retrieved.

11. A method of correcting IQ distortion caused by temperature in a signal received by a digital receiver comprising the steps of:

prior to actual use of the digital receiver, providing a test signal to the digital receiver;

measuring the amount of IQ distortion of the test signal for each of a plurality of temperatures;

storing in retaining means for each of the plurality of temperatures the amount of IQ distortion measured in said measuring step; and during the actual use of the digital radio receiver, receiving a signal;

measuring the actual temperature;

retrieving from the retaining means the amount of IQ distortion associated with the actual temperature; and correcting the distortion of the signal based upon the retrieved amount of IQ distortion.

* * * * *